(12) United States Patent
Endo et al.

(10) Patent No.: US 7,799,507 B2
(45) Date of Patent: Sep. 21, 2010

(54) POSITIVE RESIST COMPOSITION FOR IMMERSION LITHOGRAPHY AND METHOD FOR FORMING RESIST PATTERN

(75) Inventors: Kotaro Endo, Kawasaki (JP); Makiko Irie, Kawasaki (JP); Takeshi Iwai, Kawasaki (JP); Yoshiyuki Utsumi, Kawasaki (JP); Yasuhiro Yoshii, Kawasaki (JP); Tsuyoshi Nakamura, Kawasaki (JP)

(73) Assignee: Tokyo Ohka Co., Ltd., Kawasaki-shi (JP)

( * ) Notice: Subject to any disclaimer, the term of this patent is extended or adjusted under 35 U.S.C. 154(b) by 0 days.

(21) Appl. No.: 12/300,760

(22) PCT Filed: Apr. 23, 2007

(86) PCT No.: PCT/JP2007/058759
§ 371 (c)(1),
(2), (4) Date: Nov. 13, 2008

(87) PCT Pub. No.: WO2007/135836
PCT Pub. Date: Nov. 29, 2007

(65) Prior Publication Data
US 2009/0117490 A1    May 7, 2009

(30) Foreign Application Priority Data
May 18, 2006 (JP) ............... 2006-138808
Sep. 13, 2006 (JP) ............... 2006-248208

(51) Int. Cl.
G03F 7/004     (2006.01)
G03F 7/30      (2006.01)

(52) U.S. Cl. .............. 430/270.1; 430/326; 430/905; 430/907; 430/910

(58) Field of Classification Search .......... 430/270.1, 430/326, 905, 907, 910
See application file for complete search history.

(56) References Cited

U.S. PATENT DOCUMENTS

| | | | |
|---|---|---|---|
| 6,329,125 B2 | 12/2001 | Takechi et al. | |
| 6,402,503 B1 | 6/2002 | Hickman | |
| 6,525,153 B1 * | 2/2003 | Jayaraman et al. | 526/281 |
| 6,962,768 B2 * | 11/2005 | Kim et al. | 430/270.1 |
| 2003/0195298 A1 * | 10/2003 | Jayaraman et al. | 525/194 |
| 2006/0008736 A1 | 1/2006 | Kanda et al. | |
| 2006/0051702 A1 | 3/2006 | Endo et al. | |
| 2006/0110677 A1 * | 5/2006 | Houlihan et al. | 430/270.1 |
| 2006/0166130 A1 * | 7/2006 | Ogata et al. | 430/270.1 |
| 2006/0210913 A1 * | 9/2006 | Ogata et al. | 430/270.1 |
| 2008/0166655 A1 * | 7/2008 | Ogata et al. | 430/270.1 |

FOREIGN PATENT DOCUMENTS

| | | |
|---|---|---|
| EP | 1 736 827 A1 | 12/2006 |
| JP | H10-161313 | 6/1998 |
| JP | 2000-235263 | 8/2000 |
| JP | 2005-284238 A | 10/2005 |
| JP | 2005-351942 A | 12/2005 |
| JP | 2006-048029 A | 2/2006 |
| JP | 2006-071889 A | 3/2006 |
| JP | 2007-065024 A | 3/2007 |
| WO | WO 2007/39346 A2 | 4/2007 |

OTHER PUBLICATIONS

Hoffnagle, J.A., "Liquid immersion deep-ultraviolet interferometric lithography." J. Vac. Sci. Technol. B vol. 17 No. 6, Nov./Dec. 1999; p. 3306-3309.
Switkes, M. "Immersion lithography at 157 nm." J. Vac. Sci. Technol. B vol. 19 No. 6, Nov./Dec. 2001; p. 2353-2356.
Switkes, M. and Rothschild, M, "Resolution Enhancement of 157 nm Lithography by Liquid Immersion." Optical Microlithography XV, Proceedings of SPIE, vol. 4691 (2002); p. 459-465.
International Search Report issued for corresponding PCT application No. PCT/JP2007/058759, dated May 22, 2007.

* cited by examiner

Primary Examiner—John S Chu
(74) Attorney, Agent, or Firm—Knobbe, Martens, Olson & Bear, LLP

(57) ABSTRACT

A positive resist composition for immersion lithography of the present invention includes a resin component (A) which exhibits increased alkali solubility under the action of acid; and an acid generator component (B) which generates acid on exposure, wherein the resin component (A) includes a cyclic main chain resin (A1) containing a fluorine atom and no acid-dissociable group, and a resin (A2) containing a structural unit (a) derived from an acrylic acid and no fluorine atom.

16 Claims, 1 Drawing Sheet

POSITIVE RESIST COMPOSITION FOR IMMERSION LITHOGRAPHY AND METHOD FOR FORMING RESIST PATTERN

RELATED APPLICATIONS

This application is the U.S. National Phase filing under 35 U.S.C. §371 of PCT/JP2007/058759, filed Apr. 23, 2007, which designated the United States and was published in a language other than English, which claims priority under 35 U.S.C. §119(a)-(d) to Japanese Patent Application No. 2006-138808, filed May 18, 2006, and Japanese Patent Application No. 2006-248208, filed Sep. 13, 2006. The contents of these applications are incorporated herein by reference in their entireties.

TECHNICAL FIELD

The present invention relates to a positive resist composition for immersion lithography which is used in immersion lithography, and a method for forming a resist pattern.

BACKGROUND ART

Lithography methods are widely used in the production of microscopic structures in a variety of electronic devices such as semiconductor devices and liquid crystal devices, and ongoing miniaturization of the structures of these devices has lead to demands for her miniaturization of the resist patterns used in these lithography processes. With current lithography methods, using the most up-to-date ArF excimer lasers, fine resist patterns with a line width of approximately 90 nm are able to be formed, but in the future, even finer pattern formation will be required.

In order to enable the formation of these types of ultra fine patterns, the development of appropriate exposure apparatus and corresponding resists is the first requirement.

In the case of resists, chemically amplified resists, which includes an acid generator which generates acid on exposure to radiation and a base resin which exhibits changed alkali solubility under the action of acid, are attracting considerable attention, and development of these resists is flourishing. According to the chemically amplified resists, high levels of resolution are achieved, a catalytic reaction or chain reaction of an acid generated by irradiation can be utilized, a quantum yield is 1 or greater, and high sensitivity can be achieved.

In positive chemically amplified resists, resins having acid-dissociable, dissolution-inhibiting groups are the most commonly used. Examples of known acid-dissociable, dissolution-inhibiting groups include acetal groups such as ethoxyethyl groups, tertiary alkyl groups such as tert-butyl groups, as well as tert-butoxycarbonyl groups and tert-butoxycarbonylmethyl groups. Furthermore, structural units derived from tertiary ester compounds of (meth)acrylic acid, such as 2-alkyl-2-adamantyl (meth)acrylates, are widely used as the structural units containing an acid-dissociable, dissolution-inhibiting group within the resin component of conventional ArF resist compositions, as disclosed in the patent reference 1 listed below.

Herein, the term "(meth)acrylic acid" is a generic term that includes both the acrylic acid in which a hydrogen atom is bonded to the α-position, and the methacrylic acid in which a methyl group is bonded to the α-position. Also, the term "(meth)acrylate ester" is a generic term that includes both the acrylate ester in which a hydrogen atom is bonded to the α-position, and the methacrylate ester in which a methyl group is bonded to the α-position.

On the other hand, in the case of the exposure apparatus, techniques such as shortening the wavelength of the light source used, and increasing the diameter of the lens aperture (NA) (namely, increasing NA) are common. For example, for a resist resolution of approximately 0.5 μm, a mercury lamp for which the main spectrum is the 436 nm g-line is used, for a resolution of approximately 0.5 to 0.30 μm, a similar mercury lamp for which the main spectrum is the 365 nm i-line is used, for a resolution of approximately 0.30 to 0.15 nm, 248 nm KrF excimer laser light is used, and for resolutions of approximately 0.15 μm or less, 193 nm ArF excimer laser light is used. In order to achieve even greater miniaturization the use of $F_2$ excimer laser light (157 ma), $Ar_2$ excimer laser light (126 nm), EUV (extreme ultraviolet radiation: 13.5 nm), EB (electron beams), and X-rays and the like is also being investigated.

However, shortening the wavelength of the light source requires a new and expensive exposure apparatus. Furthermore, if the NA value is increased, then because the resolution and the depth of focus range exist in a trade-off type relationship, even if the resolution is increased, a problem arises in that the depth of focus reduces.

Against this background, a method known as immersion exposure has been reported (for example, see non-patent references 1 to 3). This method includes a step in which exposure (immersion exposure) is conducted with the region between the lens and the resist film disposed on top of the wafer, which has conventionally been filled with air or an inert gas such as nitrogen, filled with a solvent (an immersion medium) that has a larger refractive index than the refractive index of air.

According to this type of immersion exposure, it is claimed that higher resolutions equivalent to those obtained using a shorter wavelength light source or a larger NA lens can be obtained using the same exposure light source wavelength, with no reduction in the depth of focus. Furthermore, immersion exposure can be conducted using existing exposure apparatus. As a result, it is predicted that immersion exposure will enable the formation of resist patterns of higher resolution and superior depth of focus at lower costs. Also, in the production of semiconductor elements, which requires enormous capital investment, immersion exposure is attracting considerable attention as a method that offers significant potential to the semiconductor industry, both in terms of cost and in terms of lithography properties such as resolution. Currently, water is mainly used as the immersion medium for immersion lithography.

[Patent Reference 1]
Japanese Unexamined Patent Application, First Publication No. Hei 10-161313

[Non-Patent Reference 1]
Journal of Vacuum Science & Technology B (U.S.), 1999, vol. 17, issue 6, pp. 3306 to 3309.

[Non-Patent Reference 2]
Journal of Vacuum Science & Technology B (U.S.), 2001, vol. 19, issue 6, pp. 2353 to 2356.

[Non-Patent Reference 3]
Proceedings of SPIE (U.S.), 2002, vol. 4691, pp. 459 to 465.

DISCLOSURE OF INVENTION

However, many factors associated with immersion lithography remain unknown, and the formation of an ultra fine resist pattern of a level suitable for actual use remains problematic. For example, in immersion lithography, an immersion medium comes into contact with a resist film and a lens during immersion exposure as described previously. Therefore, it is assumed that materials in a resist are eluted into an immersion medium so as to change the quality of a resist film and to deteriorate the performance thereof. Also, it is assumed that eluted materials cause the local change in refractive index of an immersion medium and the contamination of lens surface. For these reasons, it is afraid that the lithography properties are subject to adverse effects. In other words, the problems are predicted, in which sensitivity would be deteriorated, a resulting resist pattern would be T-top shaped, and surface roughness and swelling of a resist pattern would occur.

As a method to solve the aforementioned problems, for example, it is studied to reduce the affinity of a resist film to an immersion medium. For example, currently an aqueous solvent such as water is mainly studied as an immersion medium, and so it is speculated that the reduction in the hydrophilicity of the surface of a resist film, i.e. the improvement of the hydrophobicity (water repellency) would be effective for the solution of the aforementioned problems.

However, the improvement of the hydrophobicity of a resist film requires the change of the composition of a resist which usually deteriorate lithography properties. Therefore, although the hydrophobicity of a resist film is improved to use for immersion lithography, it is difficult to form a fine pattern at a level for practical use.

The present invention takes these problems into consideration, with an object of providing a resist composition for immersion lithography which is suitable for immersion lithography and can form a resist film in which the hydrophobicity of the film surface is high and the lithography properties are excellent, and a method for forming a resist pattern.

As a result of intensive investigation, the inventors of the present invention discovered that by simultaneously using a specific resin containing a fluorine atom and an acrylic resin containing no fluorine atom, the above object could be achieved, and they were therefore able to complete the present invention.

In other words, a first aspect of the present invention is a positive resist composition for immersion lithography that includes a resin component (A) which exhibits increased alkali solubility under the action of acid; and an acid generator component (B) which generates acid on exposure, wherein the resin component (A) includes a cyclic main chain resin (A1) containing a fluorine atom and no acid-dissociable group, and a resin (A2) containing a structural unit (a) derived from an acrylic acid and no fluorine atom.

Moreover, a second aspect of the present invention is a method for forming a positive resist pattern that includes forming a resist film on a substrate using the resist composition for immersion exposure of the first aspect conducting immersion exposure of the resist film, and developing the resist film to form a resist pattern.

In the present description and claims, the term "structural unit" refers to a monomer unit that contributes to the formation of a polymer (resin).

The term "alkyl group", unless stated otherwise, refers to a straight-chain, branched-chain, or cyclic alkyl group.

The term "lower alkyl group" refers to an alkyl group having 1 to 5 carbon atoms.

The term "exposure" is not limited to irradiation with light, but describes a general concept that includes irradiation with any form of radiation, such as an electron beam.

The present invention is able to provide a resist composition for immersion lithography which is suitable for immersion lithography and can form a resist film in which the hydrophobicity of the film surface is high and the lithography properties are excellent, and a method for forming a resist pattern.

BEST MODE FOR CARRYING OUT THE INVENTION

Figure 1:
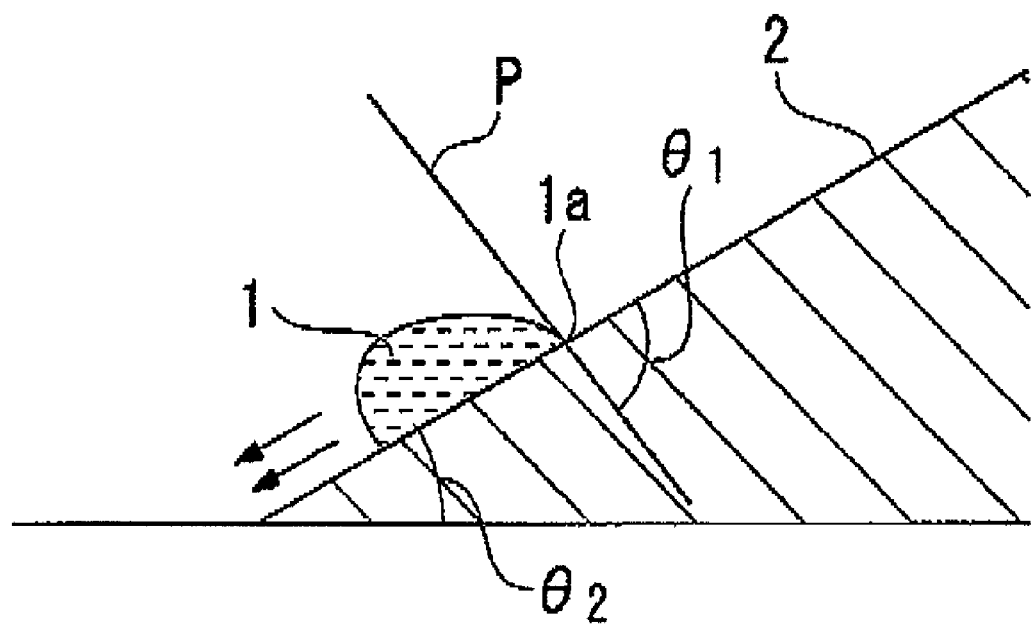
FIG. 1 is a schematic diagram describing a receding angle ($\theta_1$) and a sliding angle ($\theta_2$).

As follows is a more detailed description of the present invention.

<<Positive Resist Composition for Immersion Lithography>>

A positive resist composition for immersion lithography of the present invention includes a resin component (A) which exhibits increased alkali solubility under the action of acid (hereinafter referred to as the component (A)); and au acid generator component (B) which generates acid on exposure (hereinafter referred to as the component A)).

In this positive resist composition, the component (A) is alkali insoluble before exposure. When an acid is generated from the component (B) on exposure, the acid increases the alkali solubility of the component (A). As a result when the resist film obtained using the positive resist composition is selectively exposed during the formation of a resist pattern, the exposed portions of the resist shift to an alkali-soluble state, whereas the unexposed portions remain insoluble in alkali, meaning that alkali developing can then be used to form a positive resist pattern.

<Component (A)>[Resin (A1)]

The resin (A1) is a cyclic main chain resin containing a fluorine atom and no acid-dissociable group.

In the present description and claims, the term "acid-dissociable group" refers to a group which is dissociated under the action of acid generated from the component (B). Examples of an acid-dissociable group dose not include -Q-NH—$SO_2R^5$ in the structural unit (a'1), —CO—O—$R^7$ in the structural unit (a'2), a lactone-containing cyclic group in the structural unit (a2), a polar group-containing aliphatic hydrocarbon group in the structural unit (a3), and a polycyclic aliphatic hydrocarbon group in the structural unit (a4), which are described below.

An acid-dissociable group is not particularly limited as long as it is dissociated under the action of acid generated from the component (B), and for example, it is possible to use any groups that have been proposed as acid-dissociable, dissolution-inhibiting groups for the base resins of chemically amplified resists. Specific examples of acid-dissociable, dissolution-inhibiting groups include groups exemplified as acid-dissociable, dissolution-inhibiting groups in the structural unit (a1) described below.

Herein, the term "dissolution-inhibiting" of acid-dissociable, dissolution-inhibiting groups means that the acid-dissociable, dissolution-inhibiting groups have an effect of inhibiting the dissolubility of the component (A) to an alkali such as an alkali developing solution (dissolution-inhibiting effect). The acid-dissociable, dissolution-Inhibiting groups of the structural unit (a1) are, as described above, the acid-dissociable group that is dissociated under the action of acid generated from the component (B), and the alkali solubility of the component (A) is increased by the dissociation of this group.

In the present invention, an "acid-dissociable group" may have a dissolution-inhibiting effect, or not.

In the present description and claims, the term "cyclic main chain resin" refers to the resin which include a resin-constituting structural unit containing a monocyclic or polycyclic ring structure, in which at least one, preferably two or more, carbon atoms of the ring structure constitutes the main chain (hereinafter, may be referred to as a cyclic main chain structural unit).

A resist film with a highly hydrophobic surface can be obtained by including the aforementioned resin (A1). Etching resistance is also improved. It is speculated that the improvement of etching resistance is because the carbon content is increased by the inclusion of the cyclic main chain structural units.

Examples of the cyclic main chain structural unit include structural units derived from polycycloolefin (polycyclic olefin) and dicarboxylic acid anhydride-containing structural units exemplified in relation to the structural unit (a'3) described below.

Of these, it is preferable to include structural units derived from polycycloolefin within the main chain because etching properties are good when a resist is produced.

As the structural unit derived from polycycloolefin, the structural unit containing the basic structure represented by the general formula (a') shown below is preferred.

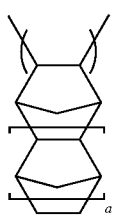

(a')

[In the above formula, a represents 0 or 1.]

In the formula (a'), a represents 0 or 1, and preferably 0 in terms of industrial availability.

"The structural unit containing the basic structure represented by the general formula (a')" may be structural units represented by the general formula (a') (i.e. structural its derived from bicyclo[2.2.1]-2-heptene (norbornene) and the structural units derived from tetracyclo[4.4.0.1$^{2.5}$.1$^{7.10}$]-3-dodecene, and may be structural units having a substituent(s) on the ring structure, such as the structural units (a'1) to (a'3) described below. In other words, examples of "the structural unit containing the basic structure represented by the general formula (a')" include structural units in which at least one or all of the hydrogen atoms bonded to the carbon atoms constituting the ring structure (bicyclo[2.2.1]-2-heptene and tetracyclo[4.4.0.1$^{2.5}$.1$^{7.10}$]-3-dodecene) have been substituted by substituent groups or atoms other than a hydrogen atom.

In addition to the cyclic main chain structural wits, the resin (A1) may also include the structural unit (a) exemplified in relation to the resin (A2) described below (a structural unit derived from acrylic acid). However, in terms of the effects of the present invention (that is, a resist film with a highly hydrophobic surface and good lithography properties can be formed), the proportion of the cyclic main chain structural unit within the resin (A1), based on the combined total of all the structural units that constitute the resin (A1), is preferably within a range from 50 to 100 mol %, and more preferably from 80 to 100 mol %.

Structural Unit (a'1)

The resin (A1) preferably includes the structural unit (a'1) represented by the general formula (I) shown below because the effects of the present invention (a resist film with a highly hydrophobic surface and good lithography properties can be formed) become significant.

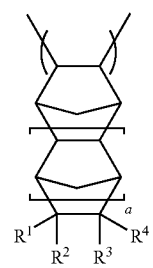

(I)

[In the formula (I) $R^1$ to $R^4$ each independently represents a hydrogen atom, a straight-chain or branched-chain alkyl group, a straight-chain or branched-chain fluorinated alkyl group, or a group (Ia) represented by a general formula (a), in which at least one of $R^1$ to $R^4$ represent the group (Ia); and a represents 0 or 1.]

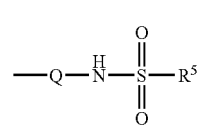

(Ia)

[In the formula (Ia), Q represents a straight-chain or branched-chain alkylene group having 1 to 5 carbon atoms; and $R^5$ represents a fluorinated alkyl group.]

The structural unit (a'1) represented by a general formula (I) contains, as a substituent group, the group (Ia) represented by the general formula (Ia) at the specific position on the ring in the structural unit containing the basic structure represented by the general formula (a').

In the present invention, the hydrophobicity of the surface of the resist film is improved by including the aforementioned structural unit. The lithography properties are also improved. The reason why the aforementioned effects can be obtained is not clear. However, the inclusion of the group (Ia) can produce the hydrophobicity improvement effect of the resist film due to a fluorine atom. In addition, the alkali solubility of the resin (A1) is improved. These improvements are speculated to contribute the improvement of the various lithography properties such as resolution and resist pattern shape.

In the formula (I), a is the same as a in the aforementioned formula (a').

The alkyl groups represented by $R^1$ to $R^4$ may be straight-chain or branched-chain, and are preferably an alkyl group having 1 to 10 carbon atoms, more preferably an alkyl group having 1 to 8 carbon atoms, and even more preferably an alkyl group having 1 to 5 carbon atoms. Examples of the alkyl group include a methyl group, an ethyl group, a propyl group, an isopropyl group, an n-butyl group, an isobutyl group, a pentyl group, an isopentyl group, and a neopentyl group.

The fluorinated alkyl groups represented by $R^1$ to $R^4$ are the group in which at least one or all of hydrogen atoms of a straight-chain or branched-chain alkyl group have been substituted by fluorine atoms. As the alkyl group for the fluorinated alkyl group, the same as the aforementioned alkyl group represented by $R^1$ to $R^4$ are exemplified.

The fluorination ratio of the fluorinated alkyl group (percentage of the number of fluorine atoms based on the total number of hydrogen atoms and fluorine atoms within the fluorinated alkyl group) is preferably within a range from 10% to 100%, more preferably from 30% to 100%, and even more preferably from 50% to 100%. When the fluorination ratio is 10% or more, the hydrophobicity improvement effect of the surface of the resist film is good.

In the general formula (Ia), the alkylene group represented by Q may be straight-chain or branched-chain, and are preferably an alkylene group having 1 to 10 carbon atoms, more preferably an alkylene group having 1 to 8 carbon atoms, and even more preferably an alkylene group having 1 to 5 carbon atoms. Examples of the alkylene group include a methylene group, an ethylene group, a propylene group, an isopropylene group, an n-butylene group, an isobutylene group, a pentene group, an isopentene group, and a neopentene group. Of these, in terms of easiness of synthesis, a straight-chain alkylene group is preferred, and a methylene group is particularly preferred.

The fluorinated alkyl group represented by $R^5$ is the group in which at least one or all of hydrogen atoms of a straight-chain, branched-chain, or cyclic alkyl group have been substituted by fluorine atoms.

Examples of the straight-chain or branched-chain alkyl group include the same group as the aforementioned fluorinated alkyl group represented by $R^1$ to $R^4$.

In the cyclic alkyl group, the carbon atoms is preferably within a range from 4 to 12, more preferably from 5 to 10, and most preferably from 6 to 10.

The fluorination ratio of the fluorinated alkyl group (percentage of the number of fluorine atoms based on the total number of hydrogen atoms and fluorine atoms within the fluorinated alkyl group) is preferably within a range from 10% to 100%, more preferably from 30% to 100%, particularly preferably from 50% to 100%, and most preferably 100%, that is, all of the hydrogen atoms have been substituted with fluorine atoms. When the fluorination ratio is 10% or more, the hydrophobicity improvement effect of the surface of the resist film is good. Therefore, even when the proportion of the resin (A1) in the component (A) is small, the enough hydrophobicity improvement effect can be obtained.

As the fluorinated alkyl groups represented by $R^5$, a straight-chain or branched-chain fluorinated alkyl group is preferred, a fluorinated alkylene group having 1 to 5 carbon atoms is more preferred, and a perfluoroalkyl group in which all of hydrogen atoms in the alkyl group have been substituted by fluorine atoms is particularly preferred. Specific examples of the perfluoroalkyl group include a trifluoromethyl group and a pentafluoroethyl group.

In the present invention, at least one of $R^1$ to $R^4$ represent the group (Ia) represented by the general formula (Ia), and the remaining $R^1$ to $R^4$ (zero to three) represent at least one selected from the group consisting of a hydrogen atom, a sight-chain or branched-chain alkyl group, and a straight-chain or branched-chain fluorinated alkyl group. In the present invention, it is preferable that at least one of $R^1$ to $R^4$ represent the group (Ia). Also, it is particularly preferable that one of $R^1$ to $R^4$ preferably represent the group (Ia) and the others (three) represent a hydrogen atom.

As the structural unit (a'1), the structural unit represented by the general formula (Ib) shown below is particularly preferred.

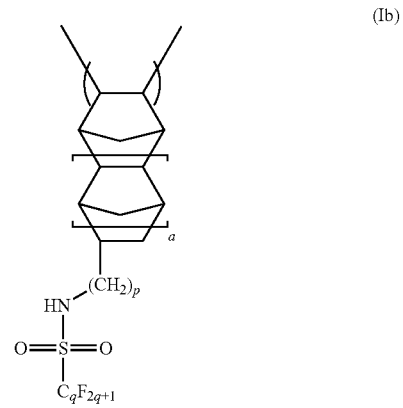

In the formula (Ib), a is the same as a in the aforementioned formula (I).

p represents an integer from 1 to 10, preferably an integer from 1 to 8, most preferably an integer of 1.

q represents an integer from 1 to 5, preferably an integer from 1 to 4, most preferably an integer of 1.

The structural unit (a'1) may be used alone or in a combination of two or more kinds thereof.

Within the resin (A1), the proportion of the structural unit (a'1) is preferably 30 mol % or more, more preferably 40 mol % or more, and even more preferably 45 mol % or more, relative to the combined total of all the structural units that constitute the component (A1). When the proportion of the structural unit (a0) is 30 mol % or more, the effects of the present invention is improved.

The upper limit of the proportion of the structural unit (a'1) is not particularly restricted, and may be 10 mol %. For example, when other structural units such as the structural unit (a'2) described below are included the upper limit is preferably 95 mol % or less, more preferably 90 mol % or less, and even more preferably 70 mol % or less, in terms of the balance with other structural units.

The monomer that derives the structural unit (a'1) can be synthesized, for example, by using the method disclosed in U.S. Pat. No. 6,420,503.

Structural Unit (a'2)

The resin (A1) preferably includes the structural unit (a'2) represented by the general formula (II) shown below in addition to the aforementioned structural unit (a'1).

The structural unit (a'2) is the structural unit containing the basic structure represented by the general formula (a') in which a fluorinated alkyloxycarbonyl group is bonded to the 5 position of the ring in the case of a=0 or the 8 position of the ring in the case of a=1.

When the resin (A1) includes the structural unit (a'2), the hydrophobicity of the surface of the resist film is further improved.

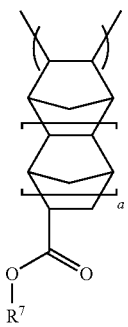

(II)

[In the formula (II), $R^7$ represents a fluorinated alkyl group; and a represents 0 or 1.]

In the formula (II), a is the same as a in the aforementioned formula (a').

Examples of a fluorinated alkyl group represented by $R^7$ include the same groups as those exemplified as a fluorinated alkyl group represented by $R^5$ in the aforementioned formula (Ia).

As the fluorinated alkyl groups represented by $R^7$, a fluoroalkyl group, in which at least one of hydrogen atoms in the alkyl group have been substituted by fluorine atoms, is preferred. Examples of the fluoroalkyl group include a group, in which one hydrogen atom in the alkyl group has been substituted by a perfluoroalkyl group, (a perfluoroalkyl group to which an alkylene group is bonded).

The fluorination ratio of the fluorinated alkyl group is preferably within a range from 30% to 90%, and more preferably from 50% to 80%. When the fluorination ratio is 30% or more, the hydrophobicity improvement effect of the surface of the resist film is good. When the fluorination ratio is 90% or less, lithography properties are improved.

The structural with (a'2) may be used alone or in a combination of two or more kinds thereof.

Within the resin (A1), the proportion of the structural unit (a'2) is preferably 5 to 60 mol %, more preferably 11 to 60 mol %, and even more preferably 30 to 60 mol % relative to the combined total of all the structural units that constitute the component (A1). When the proportion of the structural unit (a0) is the lower limit or more, the effects originated from the inclusion of the structural unit (a'2) (that is, the hydrophobicity of the surface of a resist film is further improved) is good. When the proportion of the structural unit (a0) is the upper limit or less, a more good balance can be achieved with the other structural units, and lithography properties are improved.

The monomer that derives the structural unit (a'2) can be synthesized, as described in Japanese Unexamined Patent Application, First Publication No. 2000-235263 for example, by reacting a fluorinated alkylester of a (meth)acrylic acid with cyclopentadiene or dicyclopentadiene using the Diels-Alder reaction which is a known reaction.

Other Structural Unit (a'3)

The resin (A1) may include other structural units (a'3) in addition to the aforementioned structural units (a'1) and (a'2) as long as the inclusion of these other structural units does not impair the effects of the present invention (that is, a resist film with a highly hydrophobic surface and good lithography properties can be formed).

As the structural unit (a'4), any other structural unit, which contains no acid-dissociable group, cannot be classified as one of the aforementioned structural units (a'1) and (a'2), and is derived from the monomer that can be copolymerized with the monomers deriving the structural units (a'1) and (a'2), can be used without any particular limitations.

As the structural unit (a'3), the structural unit derived from a known compound containing an ethylene-based double bond can be arbitrarily used for any purpose.

More specific examples of the structural unit (a'3) include structural units derived from an acrylic acid such as the structural units (a2) to (a4) exemplified for the resin (A2) described below, structural units containing an anhydride of dicarbonic acid, structural units derived from a polycycloolefin containing no substituent group, and structural units derived from a polycycloolefin containing a polycyclic, alicyclic group as a substituent group.

The term "structural units containing an anhydride of dicarbonic acid" refer to a structural unit containing the —C(O)—O—C(O)— structure. Examples thereof include structural units containing a monocyclic or polycyclic, cyclic acid anhydride, and more specific examples thereof include structural units derived from monocyclic maleic acid anhydride represented by the formula (a'31) described below, structural units derived from a polycyclic maleic acid anhydride represented by the formula (a'32) described below, and structural units derived from itaconic acid represented by the formula (a'33) described below.

(a' 31)

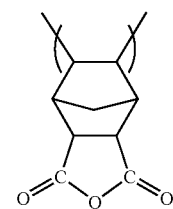

(a' 32)

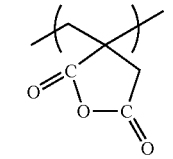

(a' 33)

Examples of structural units derived from a polycycloolefin containing no substituent group include bicyclo[2.2.1]-2-heptene (norbornene) and tetracyclo[4.4.0.1$^{2.5}$.1$^{7.10}$]-3-dodecene.

Also, examples of structural units derived from a polycycloolefin containing, as a substituent group, a polycyclic, alicyclic group include structural units derived from the aforementioned polycycloolefin containing no substituent group, which contains, on the ring, a polycyclic ring such as tricyclodecanyl group, adamantyl group or tetracyclodecanyl group.

In the resin (A1), the combination and the proportions of the structural units (a'1) to (a'3) can be appropriately adjusted according to desired properties.

The resin (A1) preferably include at least the structural unit (a'1) because the effects of the present invention (that is, a resist film with a highly hydrophobic surface and good lithography properties can be formed) is significant. Examples thereof include a unitary polymer containing the structural unit (a'1) and no structural unit (a'2) (wherein the structural unit (a'3) may be included); and a binary polymer containing the structural units (a'1) and (a'2) (wherein the structural unit (a'3) may be included).

When the resin (A1) is the binary polymer containing the structural units (a'1) and (a'2), the following proportions of the respective structural units are preferred because the effects of the present invention (that is, a resist film with a highly hydrophobic surface and good lithography properties can be formed) is significant, and the synthesis of the polymer is easily controlled. The proportion of the structural unit (a'1), based on the combined total of all the structural units that constitute the resin (A1), is preferably within a range from 40 to 95 mol %, more preferably from 40 to 90 mol %, and most preferably 40 to 70 mol %. The proportion of the structural unit (a'2) is preferably within a range from 5 to 60 mol %, more preferably from 10 to 60 mol %, and most preferably 30 to 60 mol %.

The resin (A1) can be obtained by polymerizing monomers that derive the predetermined structural units in a normal method such as a known radical polymerization using a radical polymerization initiator such as azobisisobutyronitrile (AIBN).

The weight average molecular weight (hereinafter referred to as Mw; the polystyrene equivalent weight average molecular weight determined using gel permeation chromatography (GPC).) of the resin (A1) is not particularly limited, and is preferably 20000 or less, and more preferably 10000 or less. When Mw is 20000 or less, the effects of the present invention (that is, a resist film with a highly hydrophobic surface and good lithography properties can be formed) is improved, and lithography properties such as resolution are particularly improved. In addition, the composition including the resin (A1) with Mw of 20000 is excellent in the solubility in organic solvent, and the generation of foreign matters and developing defects can be suppressed. Herein, the foreign matter refers to solid matters such as fine particle-like matters generated in the solution when the solution is produced using the composition.

The developing defect refers to general abnormalities detected by inspection of the resist pattern following developing, from directly above the resist pattern, using a surface defect inspection device such as that manufactured by KLA Tencor Corporation (trade name: KLA). Examples of these abnormalities include post-developing scum, foams dust, bridges (bridged structures across different portions of the resist pattern), color irregularities, and precipitated deposits.

The lower limit of Mw is not particularly limited, but is preferably 2000 or more, and more preferably 4000 or more. When Mw is 4000 or more, there are merits in that etching resistance is improved, the swelling of a resist pattern is hardly generated during developing, and pattern collapse is hardly generated.

Moreover, the polydispersity (Mw/Mn) is preferably within a range from about 1.0 to 5.0, and more preferably from 1.0 to 3.0.

In the (A) component, the resin (A1) may be used alone or in a combination of two or more kinds thereof.

The content of the resin (A1) in the component (A) is preferably more preferably within a range from 0.1 to 50 mass %, still more preferably from 0.1 to 25 mass %, and most preferably from 0.1 to 10 mass %. When the content of the resin (A1) is 0.1 mass % or more, the hydrophobicity is improved on the surface of the resist film formed by using the resist composition, and immersion medium resistance is improved. Also, at 50 mass % or less, the balance of the resins (A1) and (A2) is favorable so as to improve lithography properties.

[Resin (A1)]

The resin (A2) is a resin containing a structural unit (a) derived from an acrylic acid and no fluorine atom.

The resin (A2) is not particularly limited as long as it contains a structural unit (a) derived from an acrylic acid and no fluorine atom, and it is possible to use one, or two or more of the resins which have ever been proposed as base resins for chemically amplified positive resists.

[Structural Unit (a)]

In the resin (A1), a structural unit (a) derived from an acrylic acid contains no fluorine atom.

In the present specification and claims, the term "structural unit derived from an acrylic acid" refers to a structural unit formed by cleavage of the ethylene-based double bond of an acrylic acid.

The term "acrylic acid" refers to generic concept that includes a narrowly-defined acrylic acid ($CH_2$=CHCOOH), and derivatives thereof in which at least one or all of the hydrogen atoms have been substituted by other groups or atoms.

Examples of the acrylic acid derivatives include an α-substitution acrylic acid in which a substituent group (an atom or group other than a hydrogen atom) is bonded to the α-position carbon atom of the narrowly-defined acrylic acid; and an acrylate ester in which a hydrogen atom of a carboxyl group in the acrylic acid has been substituted by an organic group.

The term "organic group" refers to a carbon atom-containing group, and an organic group in an acrylate ester is not particularly limited. Examples thereof include groups bonded to the ester side chain portion of the acrylate ester in the structural units exemplified in the structural units (a1) to (a4) described below (an acid-dissociable, dissolution-inhibiting group, a lactone-containing cyclic group, a polar group-containing aliphatic hydrocarbon group, and a polycyclic aliphatic hydrocarbon group, etc).

The term "α-position (α-position carbon atom) of the acrylic acid", unless stated otherwise, refers to the carbon atom to which a carbonyl group is bonded.

Examples of the substituent groups of the α-substitution acrylic acid include a halogen atom (wherein a fluorine atom is excluded for the structural unit (a)), a lower alkyl group, and a halogenated lower alkyl group (wherein a fluorinated lower alkyl group is excluded for the structural unit (a)).

In the structural unit (a), examples of the halogen atom as the α-position substituent group include a chlorine atom, a bromine atom, and an iodine atom.

Specific examples of the lower alkyl group as the α-position substituent group include lower straight-chain or branched alkyl groups such as a methyl group, an ethyl group, a propyl group, an isopropyl group, an n-butyl group, an isobutyl group, tert-butyl group, a pentyl group, an isopentyl group, and a neopentyl group.

Examples of the halogenated lower alkyl group as the α-position substituent group include the aforementioned lower alkyl group in which at least one or all of hydrogen atoms are substituted with the aforementioned halogen atoms other than a fluorine atom. Herein, examples of the halogen atom include a chlorine atom, a bromine atom, and an iodine atom.

In the structural with (a), what is bonded to the α-position of the acrylic acid is preferably a hydrogen atom, a halogen atom other than a fluorine atom, a lower alkyl group, or a halogenated lower alkyl group (other than a fluorinated lower alkyl group), more preferably a hydrogen atom or a lower alkyl group, and most preferably a hydrogen atom and a methyl group in terms of industrial availability.

Specific examples of the structural unit (a) include the structural units represented by the general formula (a) shown below,

(a)

[In the above formula, R represents a hydrogen atom, a halogen atom other than a fluorine atom, a lower alkyl group, or a halogenated lower alkyl group (other than a fluorinated lower alkyl group); and X represents a hydrogen atom or a monovalent organic group containing no fluorine atom.]

As a halogen atom, a lower alkyl group, and a halogenated lower alkyl group (other than a fluorinated lower alkyl group) represented by R, the same atom or group as the halogen atom (other than a fluorine atom), the lower alkyl group, and the halogenated lower alkyl group (other than a fluorinated lower alkyl group) as the aforementioned α-position substituent group are exemplified.

As an organic group represented by X, the same group as the aforementioned "organic group in an acrylate ester" is exemplified as long as the group contains no fluorine atom.

The resin (A2) preferably contains the structural unit (a) within a range from 50 to 100 mol %, and more preferably from 70 to 100 mol %, relative to the combined total of all the structural units that constitute the component (A2). It is preferable that the resin (A2) consist of the structural units (a) derived from an acrylic acid because this resin is excellent in the effects of the present invention (a resist film with a highly hydrophobic surface and good lithography properties can be formed).

Herein, the term "consist of the structural units (a)" refers to the main chain of the resin (A2) that is formed solely from the structural units (a) and contains no other structural units.

Structural Unit (a1)

In the present invention, the resin (A1) preferably contains a structural unit (a1) derived from an acrylate ester containing no fluorine atom and an acid-dissociable, dissolution-inhibiting group.

Herein, the term "structural unit derived from an acrylate ester" refers to a structural unit formed by cleavage of the ethylene-based double bond of an acrylate ester.

As the acid-dissociable, dissolution-inhibiting group in the structural unit (a1), it is possible to use any groups that have been proposed as acid-dissociable, dissolution-inhibiting groups for the base resins of chemically amplified resists, as long as the groups exhibit an alkali dissolution-inhibiting effect that renders the resin (A2) insoluble in alkali prior to dissociation, but then causes the resin (A2) to become alkali-soluble upon dissociation. As these acid-dissociable, dissolution-inhibiting groups, groups that form either a cyclic or chain-like tertiary alkyl ester with a carboxyl group of (meth) acrylic acid, etc; and an acetal-based, acid-dissociable, dissolution-inhibiting group such as an alkoxyalkyl group are the most widely known generally. Herein, the term "(meth) acrylate ester" is a generic term that includes both the acrylate ester in which a hydrogen atom is bonded to the α-position, and the methacrylate ester in which a methyl group is bonded to the α-position:

Herein, the term "tertiary alkyl ester" describes a structure in which an ester is formed by substituting the hydrogen atom of a carboxyl group with a chain-like or cyclic group, and a tertiary carbon atom within the chain-like or cyclic alkyl group is bonded to the oxygen atom at the terminal of the carbonyloxy group (—C(O)—O—). In this tertiary alkyl ester, the action of acid causes cleavage of the bond between the oxygen atom and the tertiary carbon atom.

The chain-like or cyclic alkyl group may contain a substituent group.

Hereinafter, for the sake of simplicity, groups that exhibit acid dissociability as a result of the formation of a tertiary alkyl ester at a carboxyl group are referred to as "tertiary alkyl ester-based, acid-dissociable, dissolution-inhibiting groups".

Examples of these tertiary alkyl ester-based, acid-dissociable, dissolution-inhibiting groups include aliphatic branched-chain, acid-dissociable, dissolution-inhibiting groups and acid-dissociable, aliphatic cyclic group-containing, acid-dissociable, dissolution-inhibiting groups.

In this description and the appended claims, the term "aliphatic" is a relative concept used in relation to the term "aromatic", and defines a group or compound or the like that contains no aromaticity. The term "aliphatic branched-chain group" describes a branched-chain structure that contains no aromaticity.

the term "aliphatic" is a relative concept used in relation to the term "aromatic", and defines a group or compound or the like that contains no aromaticity. The term "aliphatic cyclic group" describes a monocyclic or polycyclic group that contains no aromaticity.

The structure of the "aliphatic branched-chain, acid-dissociable, dissolution-inhibiting groups" are not limited to groups formed solely from carbon and hydrogen (hydrocarbon groups), although a hydrocarbon group is preferred. In addition, "hydrocarbon groups" may be saturated or unsaturated although saturated hydrocarbon groups are usually preferred.

As the aliphatic branched-chain acid-dissociable, dissolution-inhibiting groups, tertiary alkyl group having 4 to 8 carbon atoms, and specific examples thereof include a tertbutyl group, a tert-amyl group, and tert-heptyl group.

The term "aliphatic cyclic group" refers to a monocyclic group or a polycyclic group having no aromaticity.

An "aliphatic cyclic group" in the structural unit (a1) may have a substituent group, or not. Examples of the substituent group include a lower alkyl group having 1 to 5 carbon atoms, a halogen atom other than a fluorine atom, a lower halogenated alkyl group having 1 to 5 carbon atoms substituted with a halogen atom other than a fluorine atom, an oxygen atom (═O).

The structure of the basic ring in the "aliphatic cyclic group" where the substituent group has been removed is not limited to the group composed of carbon atoms and hydrogen atoms (a hydrocarbon group), but is preferably a hydrocarbon group. Also, the "hydrocarbon group" may be either saturated or unsaturated, but is preferably saturated usually. The "aliphatic cyclic group" is preferably a polycyclic group.

Specific examples of the aliphatic cyclic group include groups in which one or more hydrogen atoms have been removed from a polycycloalkane such as a monocycloalkane, a bicycloalkane, a tricycloalkane, or a tetracycloalkane, which may be substituted with a lower alkyl group, a halogen atom other than a fluorine atom, or a halogenated alkyl group (other than a fluorinated alkyl group), or not. More specific examples thereof include groups in which one or more hydrogen atoms have been removed from a monocycloalkane such as cyclopentane or cyclohexane; or a polycycloalkane such as adamantane, norbornane, isobornane, tricyclodecane, or tetacyclododecane.

Examples of aliphatic cyclic group-containing, acid-dissociable, dissolution-inhibiting groups include groups that contain a tertiary carbon atom within the ring structure of a cycloalkyl group, and specific examples include a 2-methyl-2-adamantyl group and 2-ethyl-2-adamantyl group. Other possible examples include groups that contain an aliphatic cyclic group such as an adamantyl group, and a tertiary carbon atom-containing branched-chain alkylene group bonded thereto, such as the group bonded to the oxygen atom of the carbonyloxy group (—C(O)—O—) in the structural unit represented by the general formula (a1″) shown below.

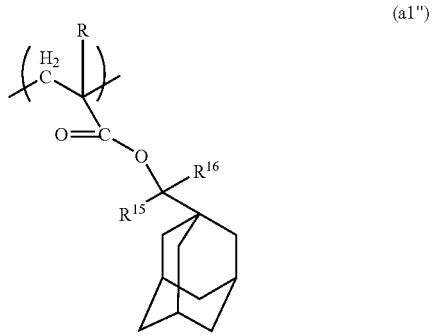
(a1″)

[In the formula, R is the same as R in the aforementioned general formula (a); and $R^{15}$ and $R^{16}$ each independently represents an alkyl group (which may be either a straight-chain or branched-chain group, and preferably contains 1 to 5 carbon atoms).]

The "acetal-based, acid-dissociable, dissolution-inhibiting group" is generally substituted for the hydrogen atom at the terminal of an alkali-soluble group such as a carboxyl group or a hydroxyl group, and is bonded to the oxygen atom. When acid is produced on exposure, the action of acid causes cleavage of the bond between the acetal-based, acid-dissociable, dissolution-inhibiting group and the oxygen atom to which the acetal-based, acid-dissociable, dissolution-inhibiting group is bonded.

As the acetal-based, acid-dissociable, dissolution-inhibiting group, the groups represented by the general formula (p1) shown below are exemplified.

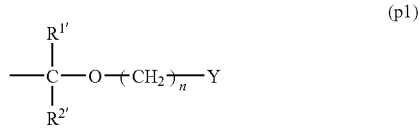
(p1)

[In the above formula, $R^{1'}$ and $R^{2'}$ each independently represents a hydrogen atom or a lower alkyl group, n represents an integer of 0 to 3, and Y represents a lower alkyl group or a aliphatic cyclic group.]

In the above formula, n preferably represents an integer of 0 to 2, more preferably 0 or 1, and most preferably 0.

As lower alkyl groups represented by $R^{1'}$ and $R^{2'}$, the same ones as the lower alkyl groups defined for the aforementioned group R are exemplified, and a methyl group or a ethyl group are preferred, and a methyl group is most preferred.

In the present invention, at least one of $R^{1'}$ and $R^{2'}$ preferably represents a hydrogen atom. In other words, the acid-dissociable, dissolution inhibiting group (p1) is preferably groups represented by the general formula (p1-1) shown below.

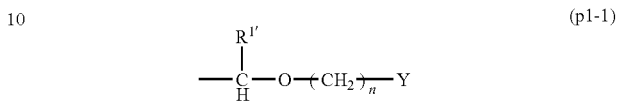
(p1-1)

[In the above formula, $R^{1'}$, n, and Y represent the same as $R^{1'}$, n, and Y in the aforementioned general formula (p1).]

As lower alkyl groups represented by Y, the same ones as the lower alkyl groups defined for the aforementioned group R are exemplified.

As aliphatic cyclic groups represented by Y, it is possible to use any of groups selected from the multitude of monocyclic or polycyclic aliphatic groups that have been proposed in ArF resists, and the same ones as the aforementioned "aliphatic cyclic groups" are exemplified.

As the acetal-based, acid-dissociable, dissolution-inhibiting group, the groups represented by the general formula (p2) shown below are exemplified.

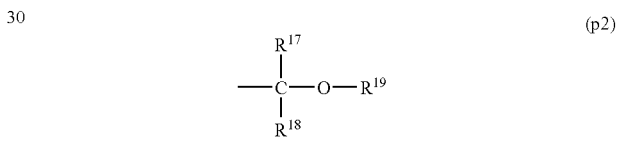
(p2)

[In the above formula, $R^{17}$ and $R^{18}$ each independently represents a straight-chain or branched-chain lower alkyl group or a hydrogen atom, and $R^{19}$ represents a straight-chain, branched-chain, or cyclic alkyl group. Alternatively, $R^{17}$ and $R^{19}$ each may independently represent a straight-chain or branched-chain alkylene group in which the terminals of $R^{17}$ and $R^{19}$ are bonded together so as to form a ring.]

In $R^{17}$ and $R^{18}$, the alkyl group preferably has 1 to 15 carbon atoms, and may be either straight-chain or branched-chain. Also, an ethyl group and a methyl group are preferred, and a methyl group is most preferred. Furthermore, it is particularly preferable that one of $R^{17}$ and $R^{18}$ represent a hydrogen atom and the other represent a methyl group.

$R^{19}$ represents a straight-chain, branched-chain, or cyclic alkyl group which preferably has 1 to 15 carbon atoms, and may be either straight-chain, branched-chain, or cyclic.

When $R^{19}$ represents a straight-chain or branched-chain alkyl group, the number of carbon atoms therein is preferably within a range from 1 to 5, an ethyl group and a methyl group are more preferred, and an ethyl group is most preferred.

When $R^{19}$ represents a cyclic alkyl group, the number of carbon atoms therein is preferably within a range from 4 to 15, more preferably from 4 to 12, and most preferably from 5 to 10. Specific examples thereof include groups in which one or more hydrogen atoms have been removed from a polycycloalkane such as a monocycloalkane, a bicycloalkane, a tricycloalkane or a tetracycloalkane, etc which may be substituted with a halogen atom other than a fluorine atom or a halogenated alkyl group (excepting a fluorinated alkyl group) or not. More specific examples thereof include groups in which one or more hydrogen atoms have been removed from a monocycloalkane such as cyclopentane or cyclohexane, or a polycycloalkane such as adamantane, norbornane, isobornane, tricyclodecane or tetracyclododecane. Among these, groups in which one or more hydrogen atoms have been removed from adamantane are preferred.

In the aforementioned formula, $R^{17}$ and $R^{19}$ each may independently represent a straight-chain or branched-chain alkylene group preferably an alkylene group having 1 to 5 carbon atoms) in which the terminals of $R^{17}$ and $R^{19}$ axe bonded together. In such cases, a cyclic group is formed from the groups $R^{17}$ and $R^{19}$, the oxygen atom to which $R^{19}$ is bonded, and the carbon atom to which the oxygen atom and the group $R^{17}$ are bonded. This type of cyclic group is preferably 4- to 7-membered rings, and more preferably 4 to 6-membered rings. Specific examples of these cyclic groups include a tetrahydropyranyl group and a tetrahydrofuranyl group.

As the structural unit (a1), it is preferable to use at least one selected from the group consisting of the structural units represented by the general formulas (a1-0-1) and (a1-0-2) shown below.

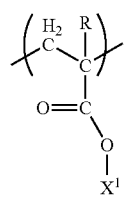

(a1-0-1)

[In the above formula, R represents a hydrogen atom, a halogen atom other than a fluorine atom a lower alkyl group, or a halogenated lower alkyl group (excepting a fluorinated lower alkyl group); and $X^1$ represents an acid-dissociable, dissolution-inhibiting group.]

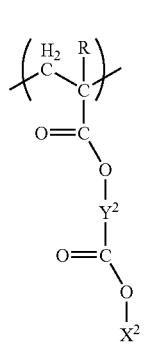

(a1-0-2)

[In the above formula, R represents a hydrogen atom, a halogen atom other than a fluorine atom, a lower alkyl group, or a halogenated lower alkyl group (excepting a fluorinated lower alkyl group); $X^2$ represents an acid-dissociable, dissolution-inhibiting group; and $Y^2$ represents an alkylene group or an aliphatic cyclic group.]

In the general formula (a1-0-1), a halogen atom, a lower alkyl group, or a halogenated lower alkyl group as R is the same as a halogen atom, a lower alkyl group, or a halogenated lower alkyl group which may be bonded to the α-position of the aforementioned acrylate ester.

$X^1$ is not particularly limited as long as it is an acid-dissociable, dissolution-inhibiting group, examples thereof include the aforementioned tertiary alkyl ester-based, acid-dissociable, dissolution-inhibiting groups, acetal-based and acid-dissociable, dissolution-inhibiting groups, and tertiary alkyl ester-based, acid-dissociable, dissolution-inhibiting groups are preferred.

In the general formula (a1-0-2), R represents the same as R in the aforementioned general formula (a1-0-1).

$X^2$ is the same as $X^1$ in the formula (a1-0-1).

$Y^2$ preferably represents an alkylene group having 1 to 4 carbon atoms or a divalent aliphatic cyclic group, and examples of the aliphatic cyclic group include the same ones as the aforementioned "aliphatic cyclic group" except that groups in which two or more hydrogen atoms have been removed are used.

More specific examples of the structural unit (a1) include the structural units represented by the general formulas (a1-1) to (a1-4) shown below.

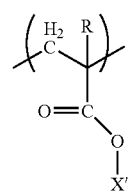

(a1-1)

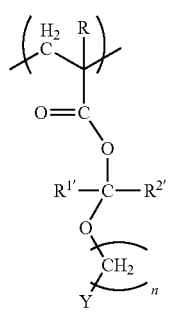

(a1-2)

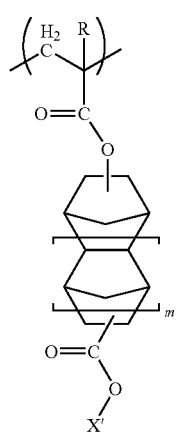

(a1-3)

-continued (a1-4)

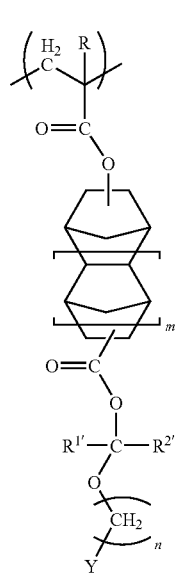

[In the above formulas, X' represents a tertiary alkyl ester-based, acid-dissociable, dissolution-inhibiting group; Y represents a lower alkyl group having 1 to 5 carbon atoms or an aliphatic cyclic group; n represents an integer from 0 to 3; m represents 0 or 1; R represents a hydrogen atom, a halogen atom other than a fluorine atom, a lower alkyl group, or a halogenated lower alkyl group (excepting a fluorinated lower alkyl group); and $R^{1'}$ and $R^{2'}$ each independently represent a hydrogen atom or a lower alkyl group of 1 to 5 carbon atoms.]

At least one of the groups $R^{1'}$ and $R^{2'}$ is preferably a hydrogen atom, and those cases in which both groups are hydrogen atoms are particularly preferred. In preferably represents either 0 or 1.

X' represents the same tertiary alkyl ester-based acid-dissociable, dissolution-inhibiting groups as those described above for $X^1$.

Examples of the aliphatic cyclic group represented by Y include the same groups as those exemplified above in the description relating to "aliphatic cyclic groups".

Specific examples of the structural units represented by the above general formulas (a1-1) to (a1-4) are show below.

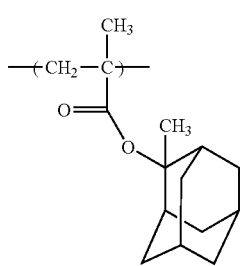

(a1-1-1)

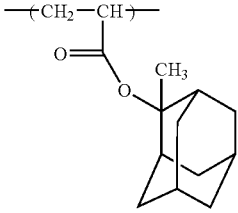

(a1-1-2)

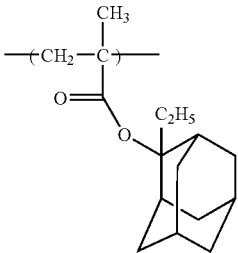

(a1-1-3)

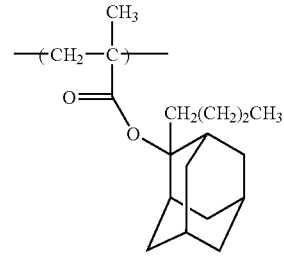

(a1-1-4)

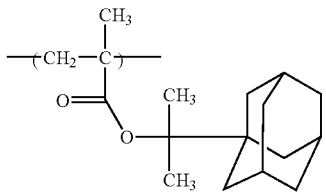

(a1-1-5)

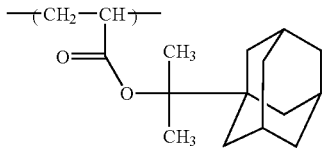

(a1-1-6)

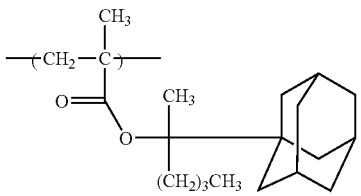

(a1-1-7)

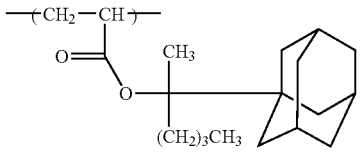

(a1-1-8)

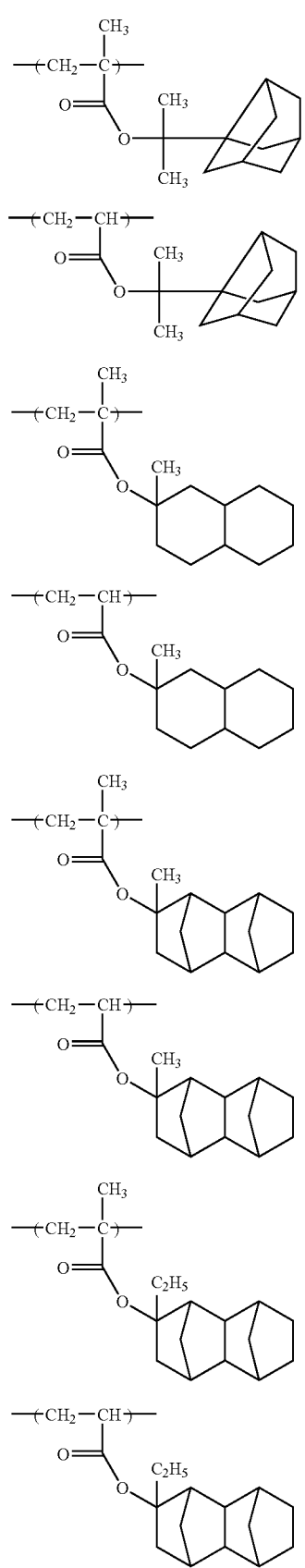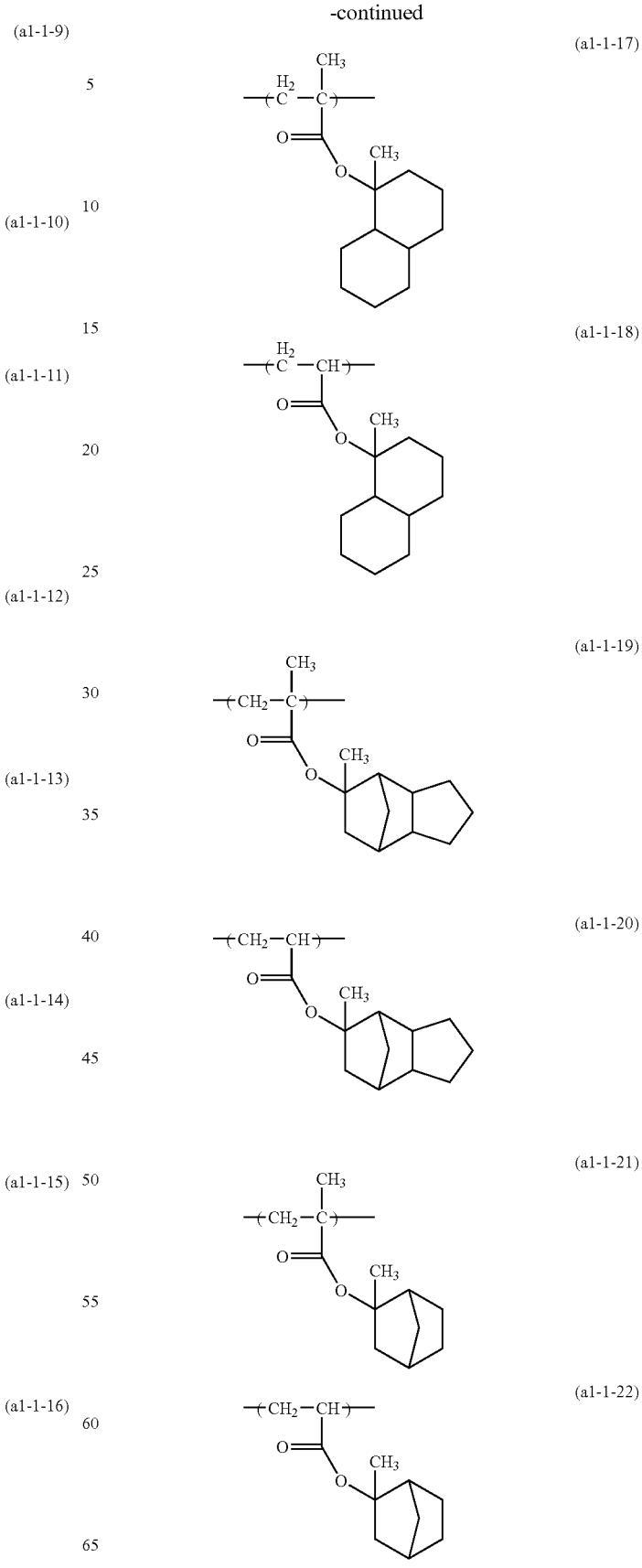

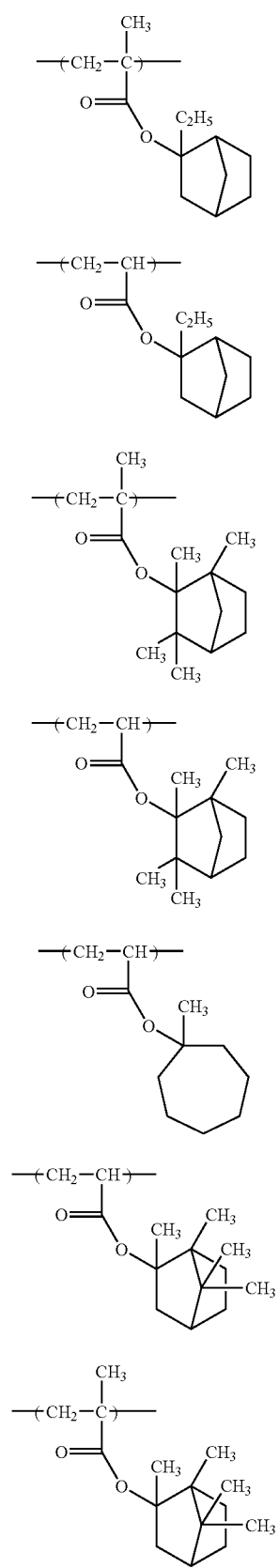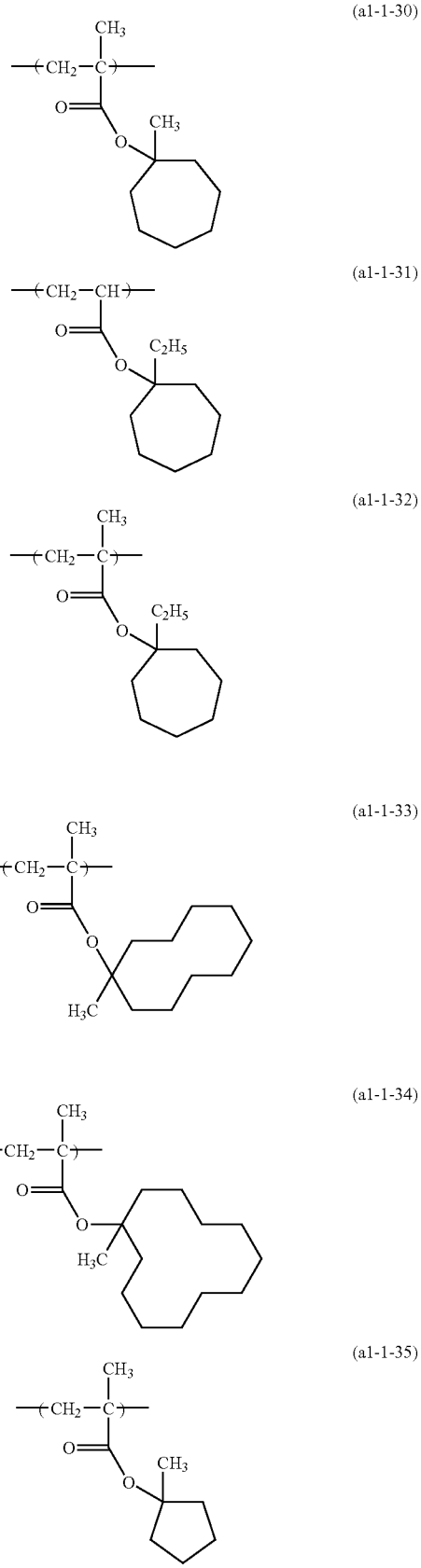

-continued
(a1-1-36)
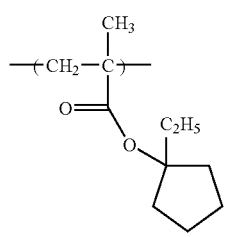
(a1-1-37)
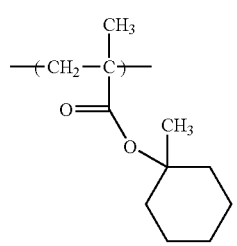
(a1-1-38)
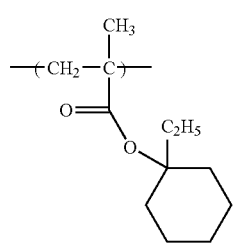
(a1-1-39)
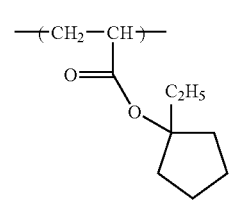
(a1-1-40)
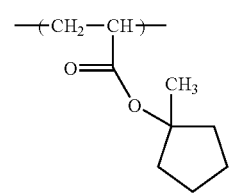
(a1-1-41)
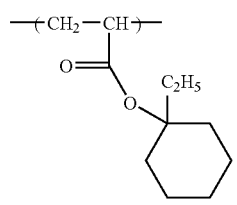
(a1-1-42)
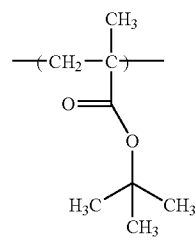
-continued
(a1-1-43)
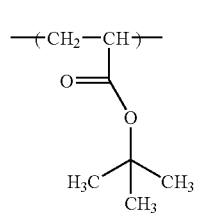
(a1-1-44)
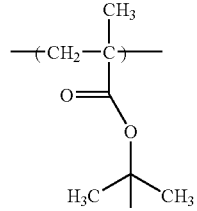
(a1-1-45)
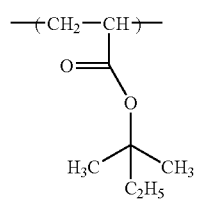
(a1-2-1)
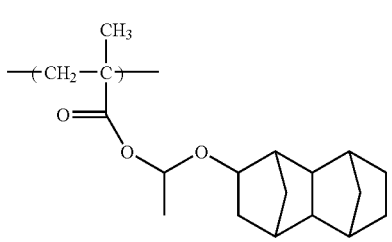
(a1-2-2)
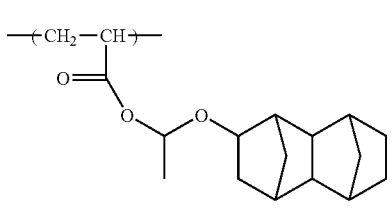
(a1-2-3)
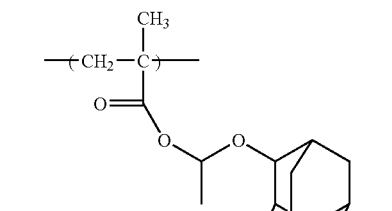
(a1-2-4)
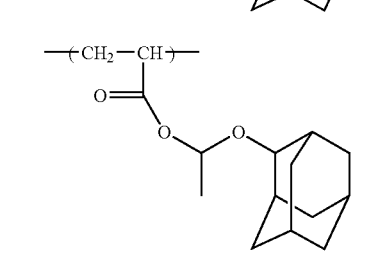

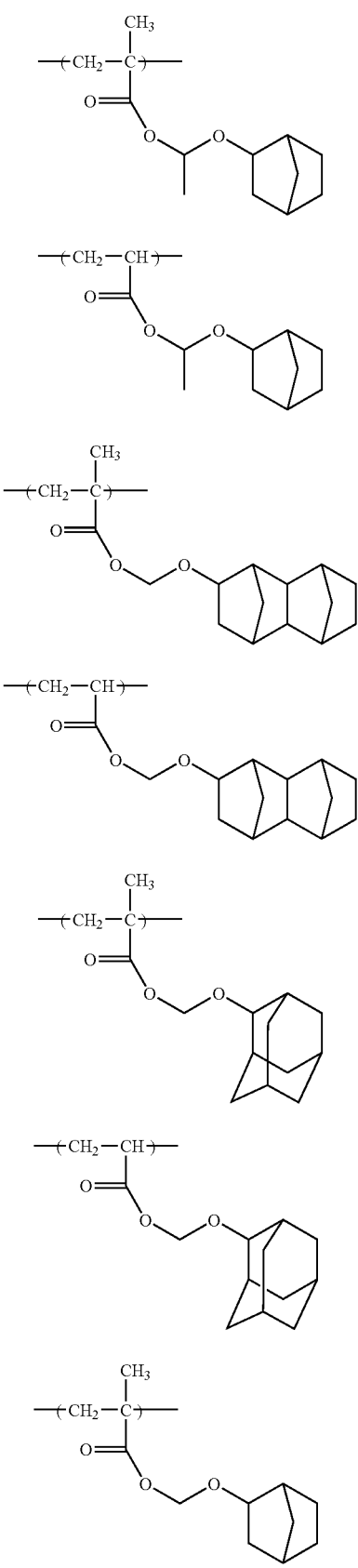
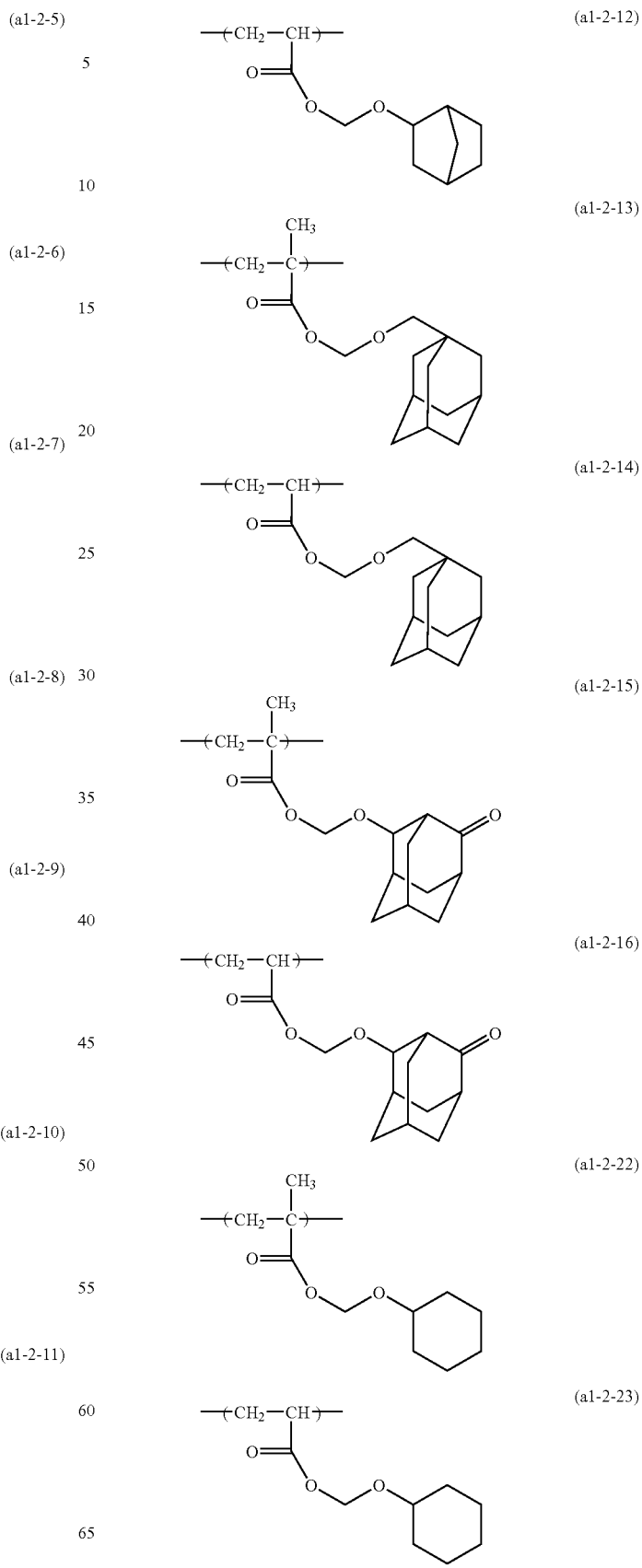

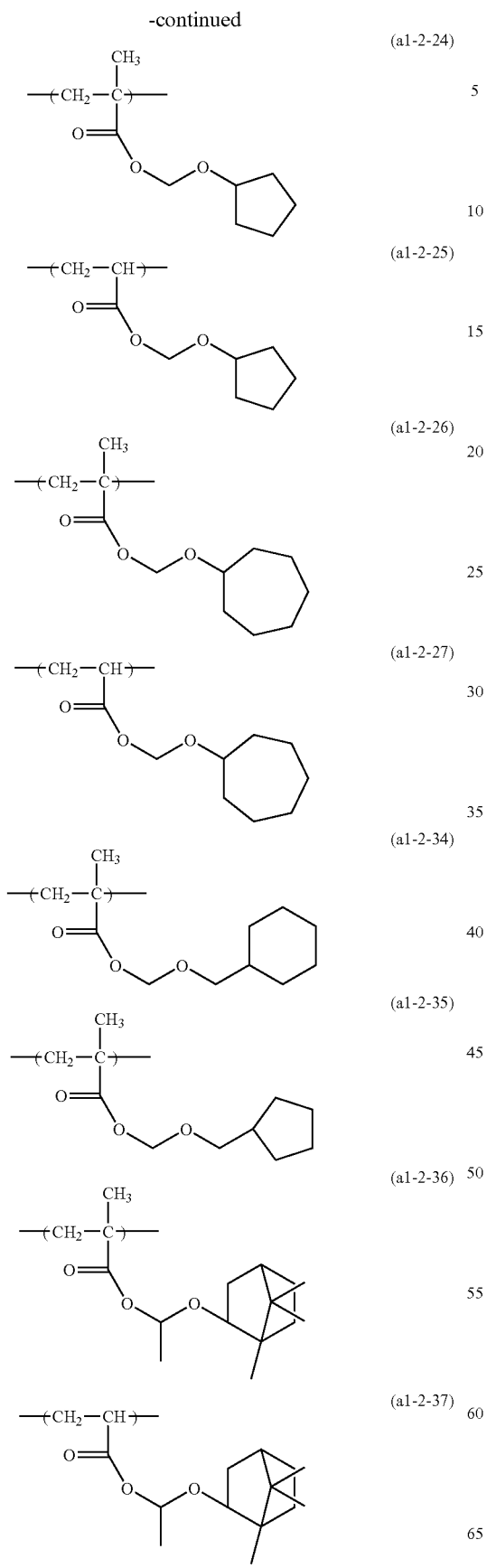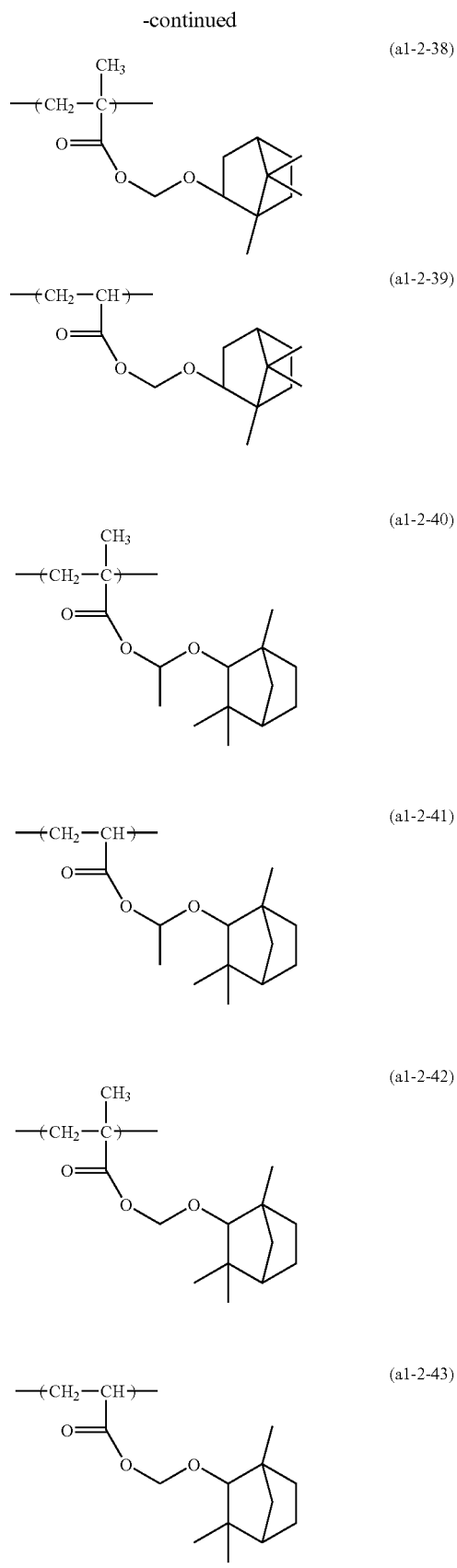

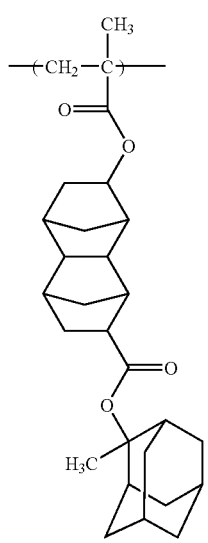
(a1-3-1)
(a1-3-2)
(a1-3-3)
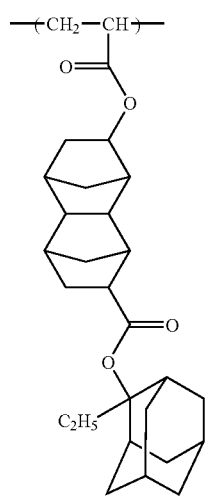
(a1-3-4)
(a1-3-5)
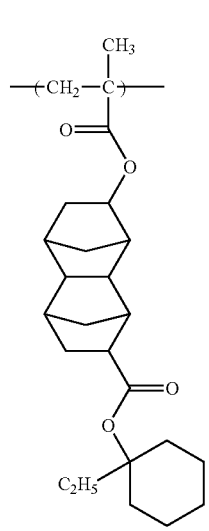
(a1-3-6)

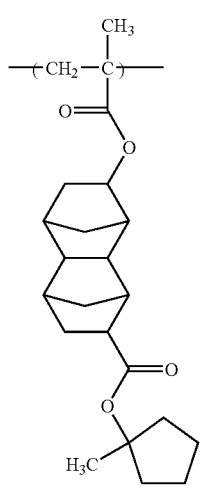 (a1-3-7)
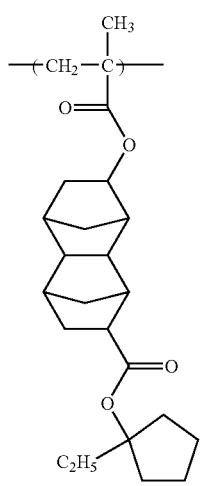 (a1-3-8)
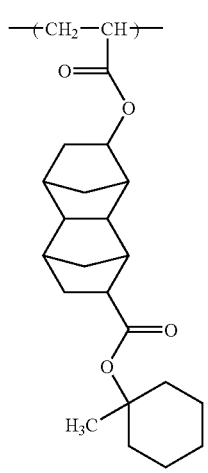 (a1-3-9)
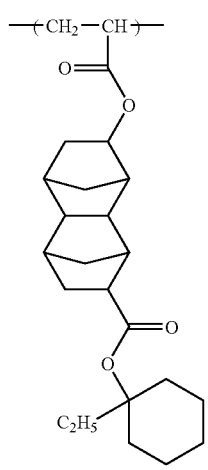 (a1-3-10)
(a1-3-11)
(a1-3-12)

(a1-3-13)
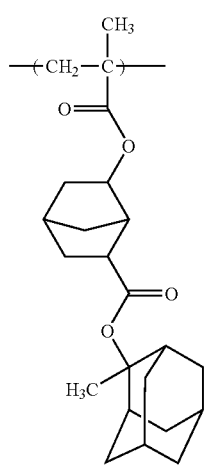
(a1-3-14)
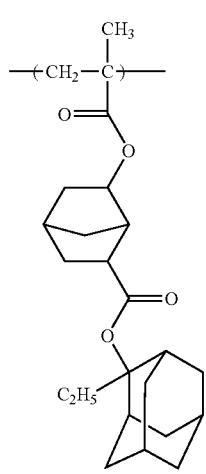
(a1-3-15)
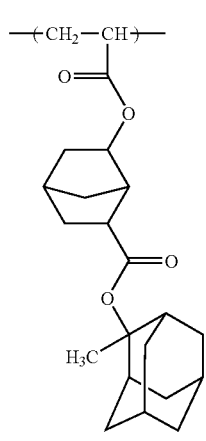
(a1-3-16)
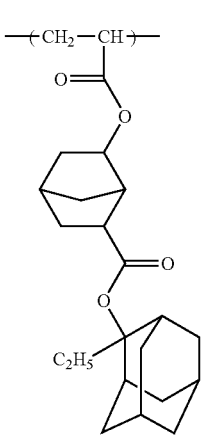
(a1-3-17)
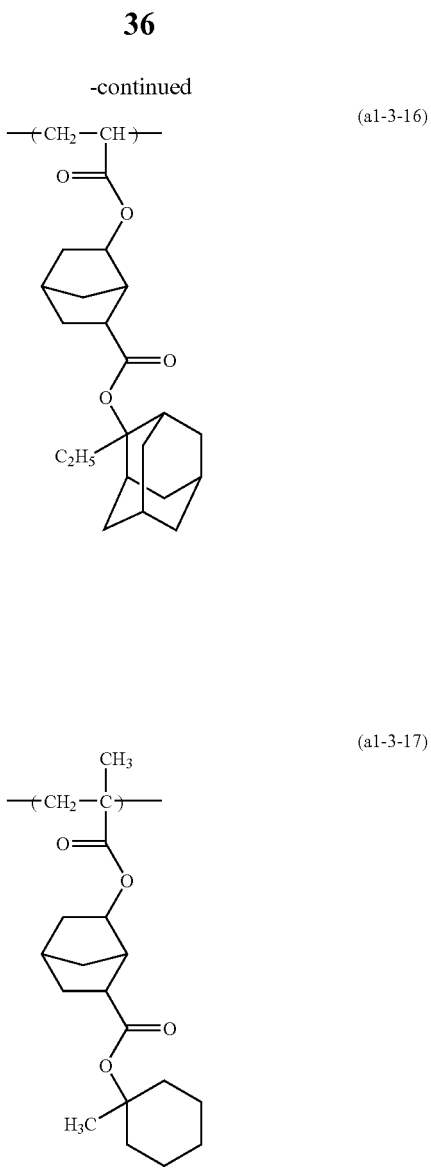
(a1-3-18)
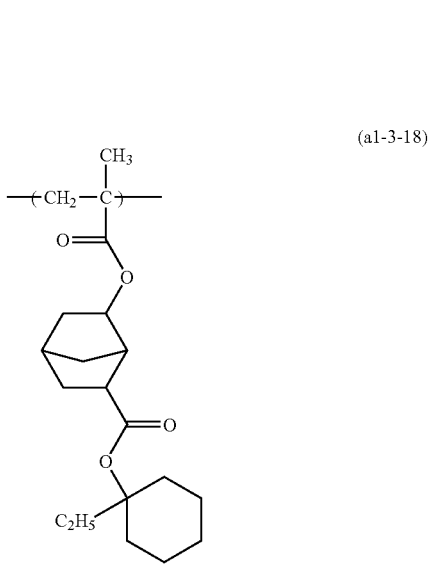

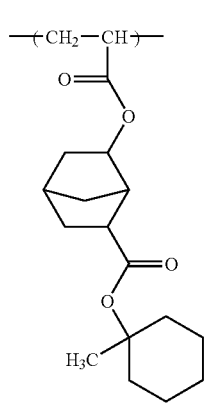
(a1-3-19)
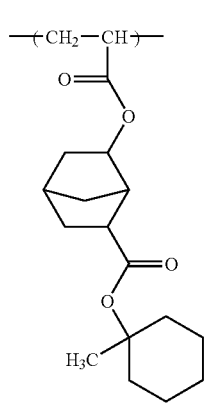
(a1-3-20)
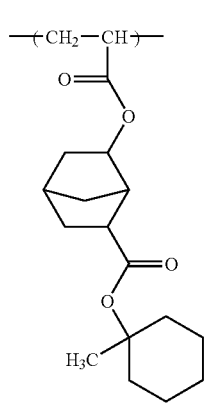
(a1-3-21)
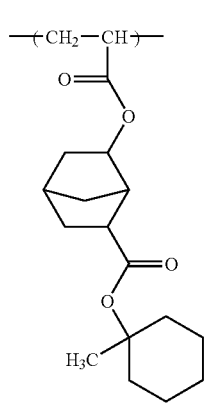
(a1-3-22)
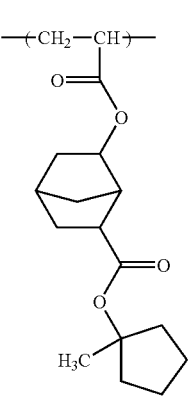
(a1-3-23)
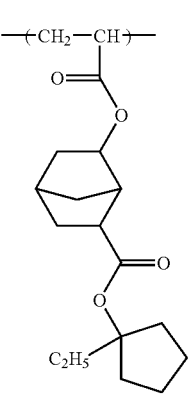
(a1-3-24)
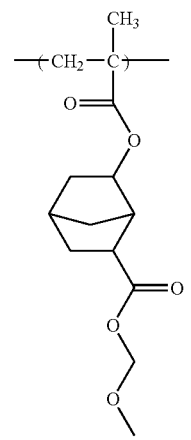
(a1-4-1)
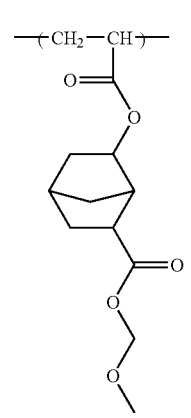
(a1-4-2)

(a1-4-3)
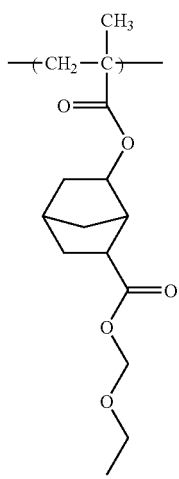
(a1-4-4)
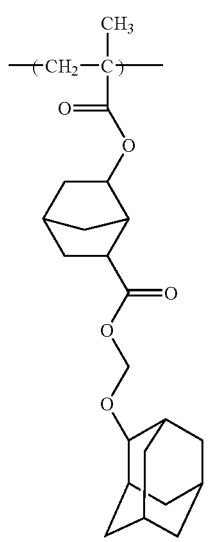
(a1-4-5)
(a1-4-6)
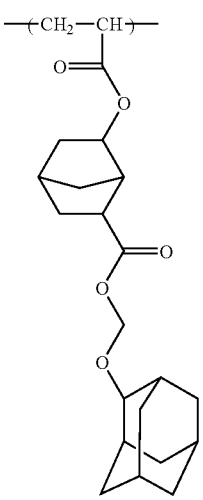
(a1-4-7)
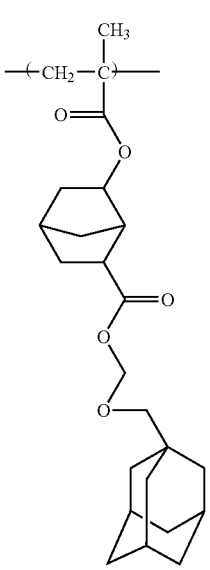
(a1-4-8)
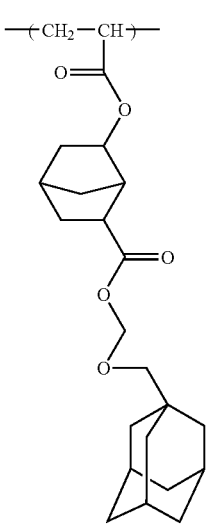

-continued
(a1-4-9)
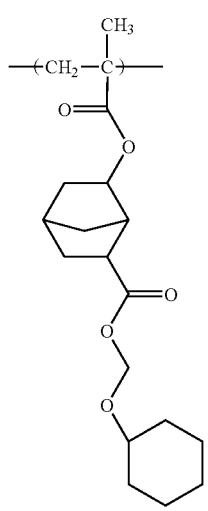
(a1-4-10)
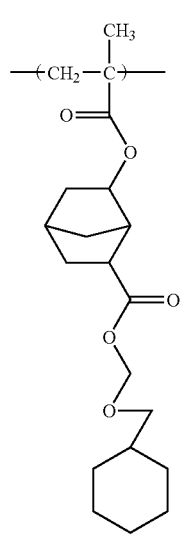
(a1-4-11)
-continued
(a1-4-12)
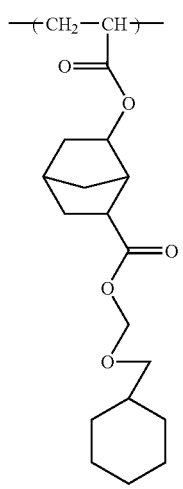
(a1-4-13)
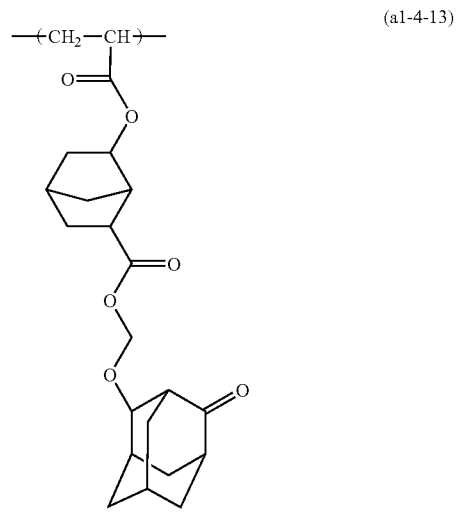
(a1-4-14)
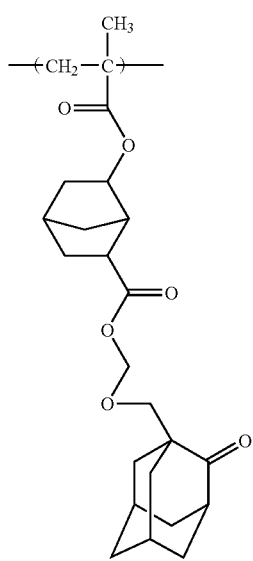

-continued
(a1-4-15)
(a1-4-16)
(a1-4-17)
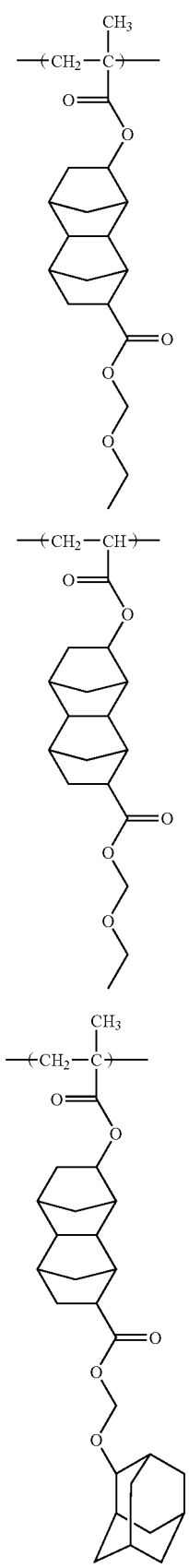
(a1-4-18)
(a1-4-19)
(a1-4-20)
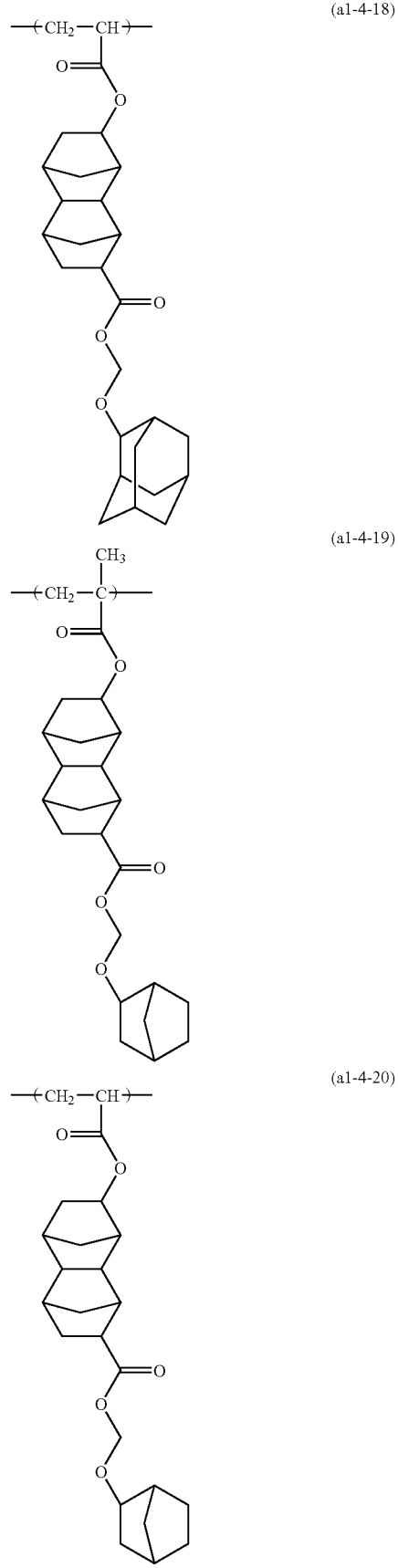

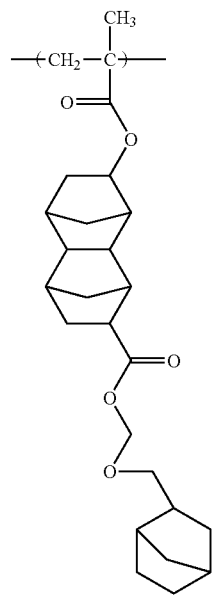
(a1-4-21)
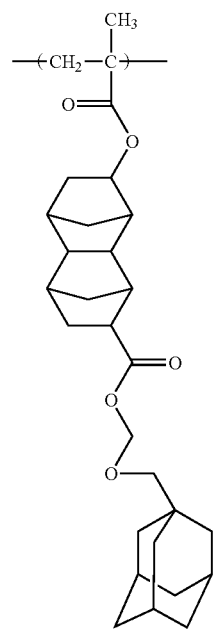
(a1-4-23)
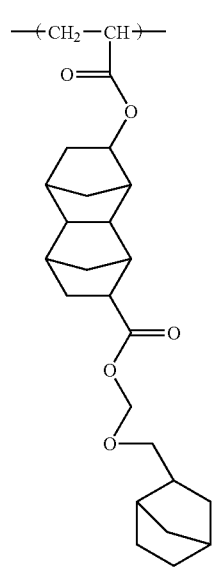
(a1-4-22)
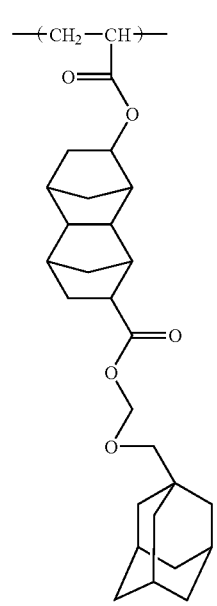
(a1-4-24)

-continued
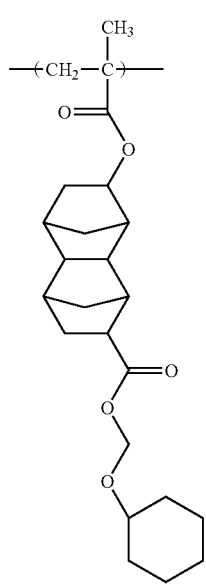
(a1-4-25)
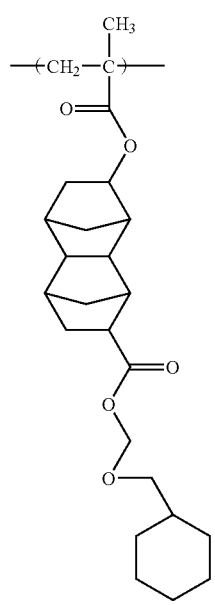
(a1-4-27)
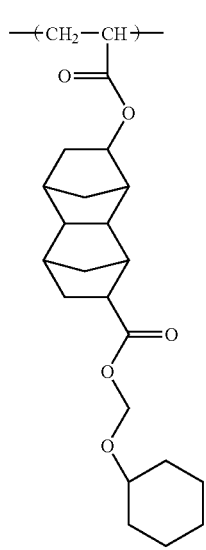
(a1-4-26)
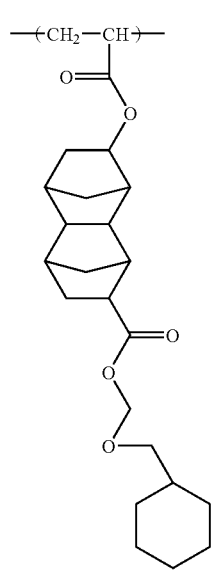
(a1-4-28)

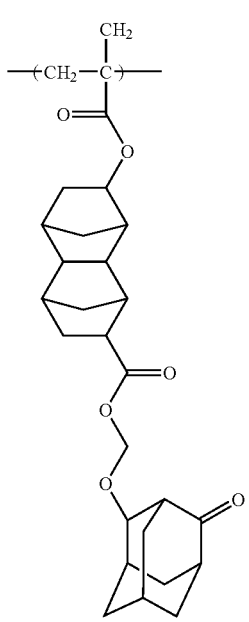

(a1-4-29)

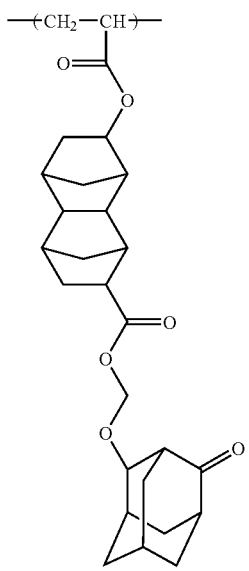

(a1-4-30)

The structural unit (a1) may be used alone or in a combination of two or more kinds thereof.

Among these, the structural units represented by the general formula (a1-1) are preferred, and it is more preferable to use one or more units selected from the structural units represented by the formulas (a1-1-1) to (a1-1-6) and the formulas (a1-1-35) to (a1-1-41).

Moreover, as the structural unit (a1), the structural units represented by the general formula (a1-1-01) shown below, which includes the structural units represented by the formulas (a1-1-1) to (a1-1-4), and the structural units represented by the general formula (a1-1-02) shown below, which includes the structural units represented by the formulas (a1-1-35) to (a1-1-41) are particularly preferred.

(a1-1-01)

[In the above formula, R represents a hydrogen atom, a halogen atom other than a fluorine atom, a lower alkyl group, or a halogenated lower alkyl group (excepting a fluorinated lower alkyl group), and $R^{11}$ represents a lower alkyl group.]

(a1-1-02)

[In the above formula, R represents a hydrogen atom, a halogen atom other than a fluorine atom, a lower alkyl group, or a halogenated lower alkyl group (excepting a fluorinated lower alkyl group), $R^{12}$ represents a lower alkyl group, and h represents an integer of 1 to 3.]

In the general formula (a1-1-01), R represents the same as R in the aforementioned general formula (a). The lower alkyl group of $R^{11}$ is the same as the lower alkyl group defined for the group R, and is preferably a methyl group or an ethyl group.

In the general formula (a1-1-02), R represents the same as R in the aforementioned.

The lower alkyl group of $R^{12}$ is the same as the lower alkyl group defined for the group R, and is preferably a methyl group or an ethyl group, and most preferably an ethyl group.

h preferably represents 1 or 2, and most preferably 2.

The proportion of the structural it (a1) within the resin (A2), relative to the combined total of all the structural units that constitute the resin (A1), is preferably within a range from 10 to 80 mol %, more preferably from 20 to 70 mol %, and even more preferably from 25 to 50 mol %. Ensuring that this proportion is at least as large as the lower limit of the above range enables a pattern to be easily obtained when the component is used in a resist composition, whereas ensuring that the proportion is no greater than the upper limit enables a more good balance to be achieved with the other structural units.

Structural Unit (a2)

The resin (A2) preferably further contains, in addition to the structural unit (a1), a structural unit (a2) derived from an acrylate ester containing no fluorine atom and a lactone-containing cyclic group.

In this description, the term "lactone-containing cyclic group" refers to a cyclic group that contains a ring containing a —O—C(O)— structure (namely, a lactone ring). This lactone ring is counted as the first ring, and groups that contain only the lactone ring are referred to as monocyclic groups, whereas groups that also contain other ring structures are described as polycyclic groups regardless of the structure of the other rings.

When the resin (A2) is used in the formation of a resist films the lactone-containing cyclic group of the structural unit (a2) is effective in improving the adhesion between the resist film and the substrate, and enhancing the affinity of the resist film relative to the water-containing developing solution.

As the structural unit (a2), any group can be used without any particular restrictions.

Specifically, examples of the lactone-containing monocyclic group include the groups in which one hydrogen atom has been removed from γ-butyrolactone. Also, examples of the lactone-containing polycyclic group include the groups in which one hydrogen atom has been removed from a lactone ring-containing bicycloalkane, tricycloalkane, or tetracycloalkane.

More specific examples of the structural unit (a2) include the structural units represented by the general formula (a2-1) to (a2-5) shown below.

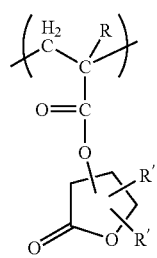
(a2-1)

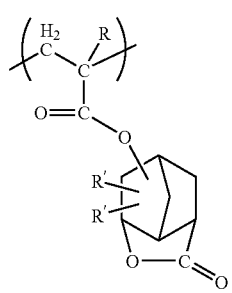
(a2-2)

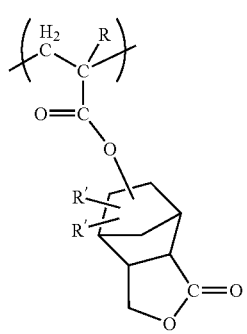
(a2-3)

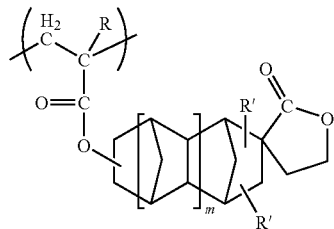
(a2-4)

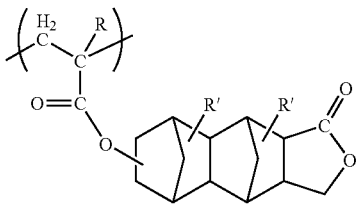
(a2-5)

[In the above formula, R represents a hydrogen atom, a halogen atom other than a fluorine atom, a lower alkyl group, or a halogenated lower alkyl group (excepting a fluorinated lower alkyl group), R' represents a hydrogen atom, a lower alkyl group, or an alkoxy group having 1 to 5 carbon atoms, and m represents an integer of 0 or 1.]

R in the general formulas (a2-1) to (a2-5) is the same as R in the aforementioned structural unit (a1).

The lower alkyl groups represented by R' are the same as the lower alkyl groups defined for the group R in the aforementioned structural unit (a1).

In the general formulas (a2-1) to (a2-5), for reasons including industrial availability, R' preferably represents a hydrogen atom.

Specific examples of the structural units represented by the general formulas (a2-1) to (a2-5) are shown below.

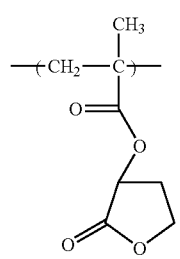
(a2-1-1)

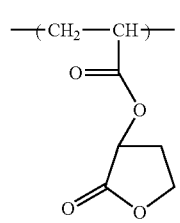
(a2-1-2)

-continued
(a2-1-3)
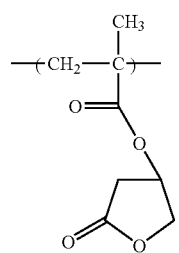
(a2-1-4)
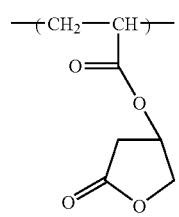
(a2-1-5)
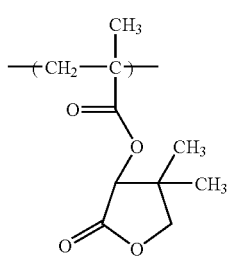
(a2-1-6)
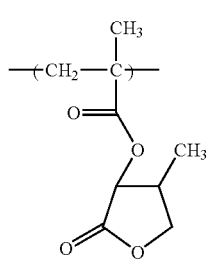
(a2-2-1)
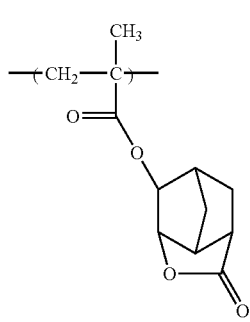
(a2-2-2)
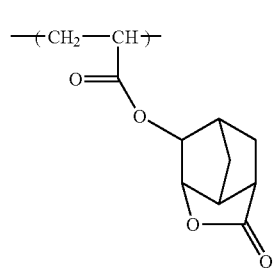
-continued
(a2-2-3)
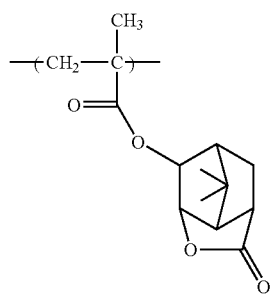
(a2-2-4)
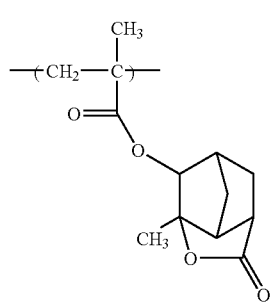
(a2-2-5)
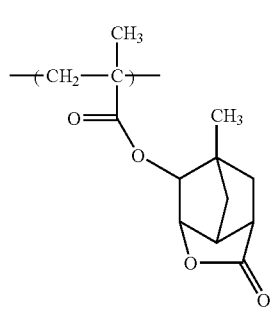
(a2-2-6)
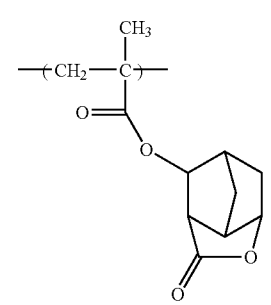
(a2-2-7)
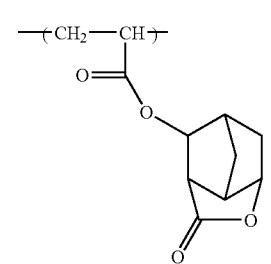

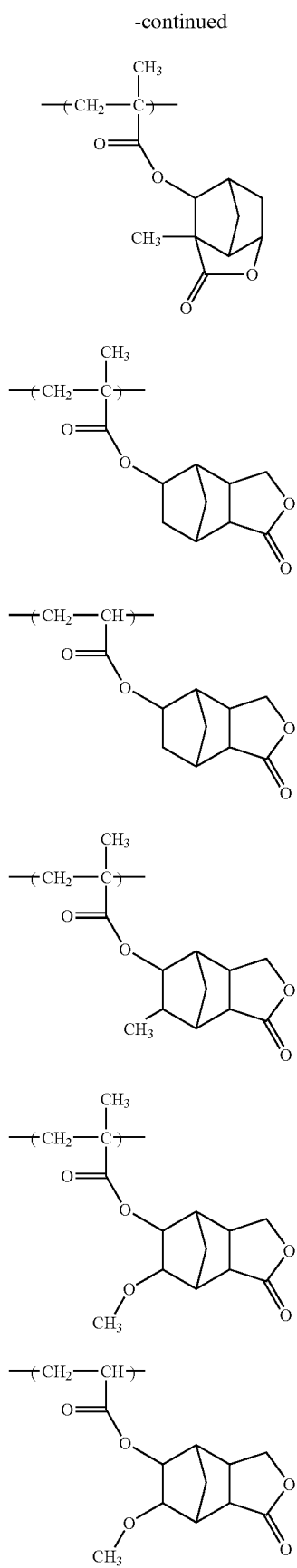

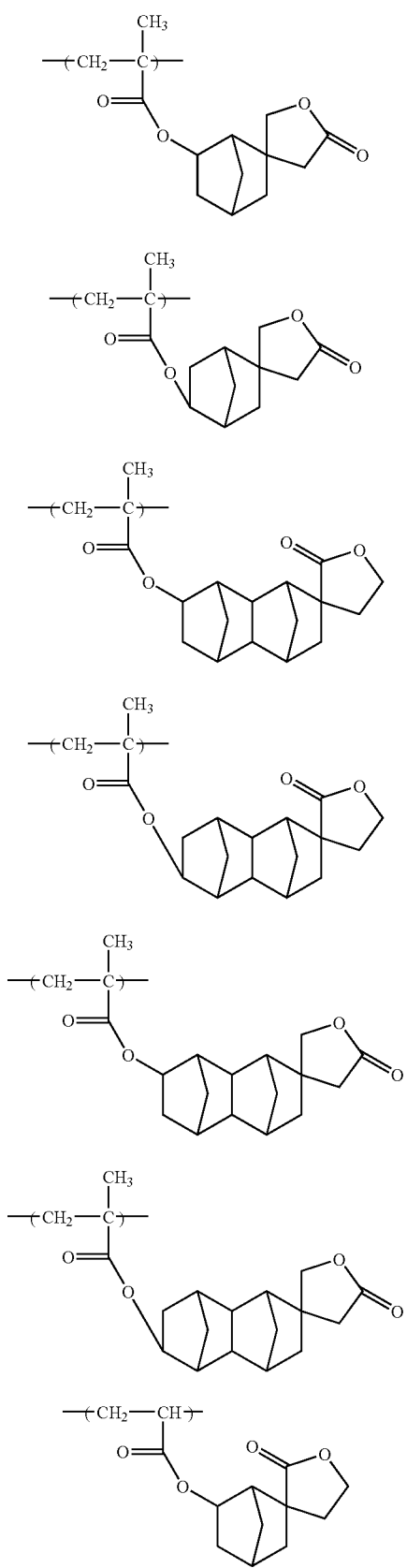
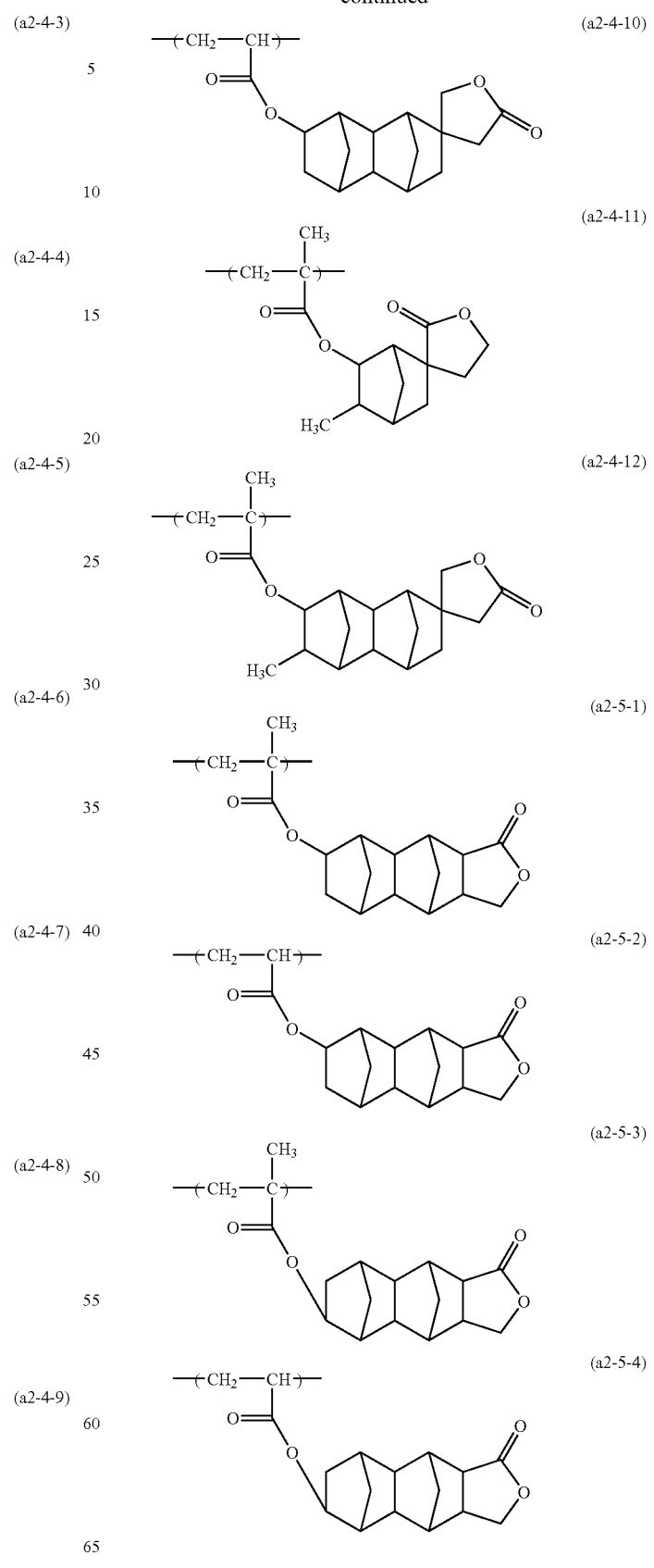

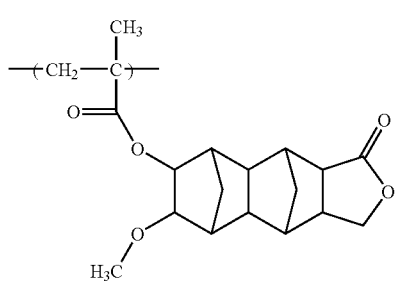

(a2-5-5)

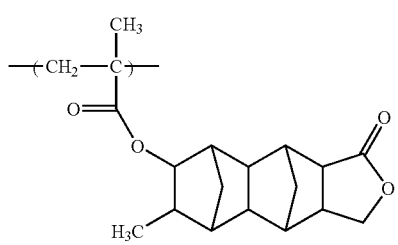

(a2-5-6)

Among these structural units, the use of at least one selected from the structural units represented by the formula (a2-1) to (a2-3) is preferred.

Specifically, the use of at least one selected from the structural units represented by the formula (a2-1-1), (a2-1-2), (a2-2-1), (a2-2-2), (a2-3-1), (a2-3-2), (a2-3-9), and (a2-3-10) is preferred.

The structural unit (a2) may be used alone, or in a combination of two or more kinds thereof.

The proportion of the structural unit (a2) within the resin (A2), relative to the combined total of all the structural units that constitute the resin (A2), is preferably within a range from 5 to 70 mol %, more preferably from 10 to 60 mol %, and even more preferably from 20 to 50 mol %. Ensuring that this proportion is at least as large as the lower limit of the above range enables the effects due to the inclusion of the structural unit (a1) (i.e. the effects of improving the adhesion between the resist film and the substrate, and enhancing the affinity of the resist film relative to the water-containing developing solution) to be obtained satisfactorily, whereas ensuring that the proportion is no greater than the upper limit enables a more favorable balance to be achieved with the other structural units.

Structural Unit (a3)

The resin (A2) preferably further includes, in addition to the structural unit (a1) or to the combination of the structural units (a1) and (a2), a structural unit (a3) derived from an acrylate ester that contains no fluorine atom and a polar group-containing aliphatic hydrocarbon group. When the resin (A2) includes the structural unit (a3), the hydrophilicity and the affinity with the developing solution are enhanced in the component (A). Then, the alkali solubility within the exposed portions of the resist is improved to thereby contribute to an improvement in the resolution.

Preferable examples of the polar group include a hydroxyl group, a cyano group, and a carboxyl group, and a hydroxyl group is particularly preferred.

Examples of the aliphatic hydrocarbon group include straight-chain or branched hydrocarbon groups (preferably alkylene groups) having 1 to 10 carbon atoms, and polycyclic aliphatic hydrocarbon groups polycyclic groups). As these polycyclic groups, it is possible to use any groups selected appropriately from the multitude of groups that have been proposed for the resins of resist compositions designed for use with ArF excimer lasers. The polycyclic groups preferably have 7 to 30 carbon atoms.

Among these, structural units derived from an acrylate ester that includes an aliphatic polycyclic group containing a hydroxyl group, a cyano group, or a carboxyl group are particularly preferred. Examples of suitable polycyclic groups include groups in which one or more hydrogen atoms have been removed from a bicycloalkane, a tricycloalkane or a tetracycloalkane, etc. Specific examples include groups in which one or more hydrogen atoms have been removed from a polycycloalkane such as adamantane, norbornane, isobornane, tricyclodecane or tetracyclododecane. Among these polycyclic groups, groups in which two or more hydrogen atoms have been removed from adamantane, groups in which two or more hydrogen atoms have been removed from norbornane, and groups in which two or more hydrogen atoms have been removed from tetracyclododecane are preferred industrially.

When the hydrocarbon group within the polar group-containing aliphatic hydrocarbon group is a straight-chain or branched hydrocarbon group having 1 to 11 carbon atoms, the structural unit (a3) is preferably a structural unit derived from the hydroxyethyl ester of the acrylic acid, whereas when the hydrocarbon group is a polycyclic group, examples of preferred structural units include the structural units represented by a formula (a3-1) and the structural units represented by a formula (a3-2), all of which are shown below.

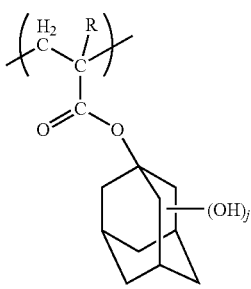

(a3-1)

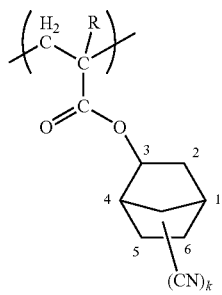

(a3-2)

[In the above formula, R represents a hydrogen atom, a halogen atom other than a fluorine atom, a lower alkyl groups or a halogenated lower alkyl group (excepting a fluorinated lower alkyl group), j represents an integer from 1 to 3, and k represents an integer from 1 to 3.]

In the formula (a3-1), j preferably represents 1 or 2, and is most preferably 1. In those cases where j represents 2, the hydroxyl groups are preferably bonded to 3-position and 5-position of the adamantyl group. In those cases where j represents 1, the hydroxyl group is preferably bonded to 3-position of the adamantyl group.

In the formula (a3-2), k preferably represents 1. The cyano group is preferably bonded to 5-position or 6-position of the norbornyl group.

The structural unit (a3) may be used alone, or in a combination of two or more kinds thereof.

The proportion of the structural unit (a3) within the resin (A2), relative to the combined total of all the structural units that constitute the component (A2), is preferably within a range from 5 to 50 mol %, even more preferably from 5 to 40 mol %, and even more preferably from 5 to 25 mol %.

Structural Unit (a4)

The resin (A2) may include other structural units (a4) in addition to the aforementioned structural units (a1) to (a3) as long as the inclusion of these other structural units does not impair the effects of the present invention (i.e. the effects that a resist film can be formed in which the hydrophobicity of the film surface is high and the lithography properties are excellent).

As the structural unit (a4), any other structural unit that contains no fluorine atom and cannot be classified as one of the aforementioned structural units (a1) to (a3) can be used without any particular limitations, and any of the multitude of conventional structural units used within resist resins for ArF excimer lasers or KrF excimer lasers (preferably for ArF excimer lasers) can be used.

Preferable examples of the structural unit (a4) include the structural units derived from an acrylate ester containing a non-acid-dissociable aliphatic polycyclic group. Examples of the polycyclic group include the same groups as those described above in relation to the structural unit (a1), and any of the multitude of conventional polycyclic groups used within the resin component of resist compositions for ArF excimer lasers or KrF excimer lasers (preferably for ArF excimer lasers) can be used.

In particular, at least one group selected from a tricyclodecanyl group, an adamantyl group, a tetracyclododecanyl group, an isobornyl group, and a norbornyl group is preferred in terms of factors such as industrial availability. The hydrogen atoms of these polycyclic groups may be substituted with straight-chain or branched alkyl groups having 1 to 5 carbon atoms.

Specific examples of the structural unit (a4) include units with structures represented by general formulas (a4-1) to (a4-5) shown below,

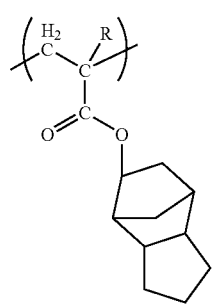
(a4-1)

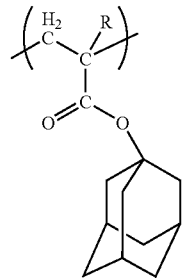
(a4-2)

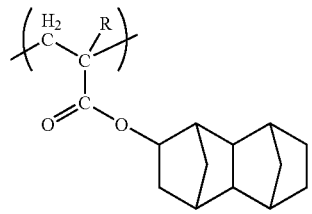
(a4-3)

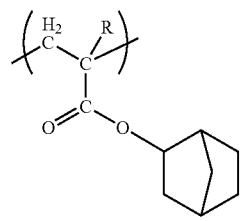
(a4-4)

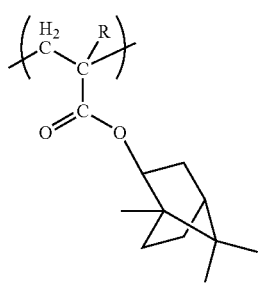
(a4-5)

[In the above formula, R represents a hydrogen atom, a halogen atom other than a fluorine atom, a lower alkyl group, or a halogenated lower alkyl group (excepting a fluorinated lower alkyl group).]

The structural unit (a4) may be used alone, or in a combination of two or more kinds thereof.

When the structural unit (a4) is included in the resin (A2), the proportion of the structural unit (a4), relative to the combined total of all the structural units that constitute the resin (A2), is preferably within a range from 1 to 30 mol %, and more preferably from 10 to 20 mol %.

In the present invention, the resin (A2) is preferably a copolymer containing at least the structural units (a1), (a2) and (a3). As such a copolymer, a copolymer formed solely from the aforementioned structural units (a1), (a2) and (a3), and a copolymer formed solely from the aforementioned structural units (a1), (a2), (Ea) and (a4) are exemplified.

In the present invention, particularly preferable examples of the resin (A2) include the resins containing three kinds of the structural units, which are represented by the general formula (A2-11) described below.

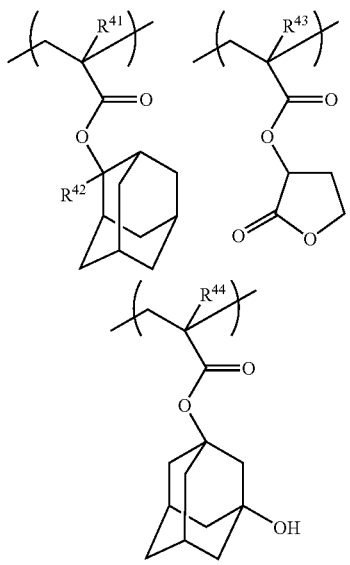

(A2-11)

[In the above formula, $R^{41}$, $R^{43}$, and $R^{44}$ each independently represents a hydrogen atom, a halogen atom other than a fluorine atom, a lower alkyl group, or a lower alkyl group in which a hydrogen atom is substituted with a halogen atom other than a fluorine atom (a halogenated lower alkyl group), and $R^{42}$ represents a lower alkyl group.]

In the formula (A2-11), lower alkyl groups represented by $R^{41}$, $R^{43}$, and $R^{44}$ are the same as the lower alkyl groups defined for the aforementioned group R. $R^{41}$, $R^{43}$, and $R^{44}$ preferably represent a hydrogen atom or a lower alkyl group, and more preferably a hydrogen atom or a methyl group. Lower alkyl groups represented by $R^{42}$ are the same as the lower alkyl groups defined for the aforementioned group R. $R^{42}$ preferably represents a methyl group or an ethyl group, and most preferably a methyl group.

The resin (A2) can be obtained by polymerizing monomers that derive each of the structural units in a normal method such as a known radical polymerization using a radical polymerization initiator such as azobisisobutyronitrile (AIBN).

Although there are no particular limitations on the weight average molecular weight (Mw) (the polystyrene equivalent value determined by gel permeation chromatography) of the resin (A2), the weight average molecular weight is preferably within a range from 2,000 to 50,000, more preferably from 3,000 to 30,000, and is most preferably from 5,000 to 20,000. Provided the weight average molecular weight is lower than the upper limit of this ranges the level of solubility within resist solvents is adequate for use within a resist whereas values larger than the lower limit of the above range ensure that favorable levels of dry etching resistance and resist pattern cross-sectional shape can be obtained.

Furthermore, the degree of dispersion (Mw/Mn) is preferably within a range from 1.0 to 5.0, even more preferably from 1.0 to 3.0, and is most preferably from 1.2 to 2.5.

In the component (A), the resin (A2) may be used alone, or in a combination of two or more kinds thereof.

The content of the resin (A2) in the component (A) is preferably within a range from 50 to 99.9 mass %, more preferably from 75 to 99.9 mass %, and still more preferably from 80 to 99.9 mass %. When the content of the resin (A1) is 99.9 mass % or less, the balance of the resins (A1) and (A2) is favorable so as to improve the hydrophobicity of the surface of a resist film and to improve immersion medium resistance. When the content of the resin (A2) is 50 mass % or more, lithography Properties are improved.

<Component (B)>

As the component (B), any acid generators that have been proposed for use within conventional chemically amplified positive resist compositions can be used without particular limitations. Examples of these acid generators are numerous, and include onium salt-based acid generators such as iodonium salts and sulfonium salts, oxime sulfonate-based acid generators, diazomethane-based acid generators such as bisalkyl or bisaryl sulfonyl diazomethanes and polybis-sulfonyl) diazometanes, nitrobenzyl sulfonate-based acid generators, iminosulfonate-based acid generators, and disulfone-based acid generators.

Examples of onium salt-based acid generators include compounds represented by a general formula (b-0) shown below,

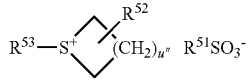

(b-0)

[wherein $R^{51}$ represents a straight-chain, branched-chain or cyclic alkyl group, or a straight-chain, branched-chain or cyclic fluorinated alkyl group; $R^{52}$ represents a hydrogen atom, a hydroxyl group, a halogen atom, a straight-chain or branched-chain alkyl group, a straight-chain or branched halogenated alkyl group, or a straight-chain or branched-chain alkoxy group; $R^{53}$ represents an aryl group that may have a substituent; and u″ represents an integer of 1 to 3.]

In the general formula (b-0), $R^{51}$ represents a straight-chain, branched-chain or cyclic alkyl group, or a straight-chain branched-chain or cyclic fluorinated alkyl group.

The straight-chain or branched-chain alkyl group preferably has 1 to 10 carbon atoms, more preferably 1 to 8 carbon atoms, and most preferably 1 to 4 carbon atoms.

The cyclic alkyl group preferably has 4 to 12 carbon atoms, more preferably 5 to 10 carbon atoms, and most preferably 6 to 10 carbon atoms.

The straight-chain or branched-chain fluorinated alkyl group preferably has 1 to 10 carbon atoms, more preferably 1 to 8 carbon atoms, and most preferably 1 to 4 carbon atoms.

The cyclic fluorinated alkyl group preferably has 4 to 12 carbon atoms, more preferably 5 to 10 carbon atoms, and most preferably 6 to 10 carbon atoms.

Moreover, the fluorination rate of the fluorinated alkyl group (the proportion of the fluorine atoms in the alkyl group) is preferably 10 to 100%, more preferably 50 to 100%, and particularly those in which all of the hydrogen atoms have been substituted with fluorine atoms, thus giving strong acidity, are preferred.

$R^{51}$ is most preferably a straight-chain alkyl group or a straight-chain fluorinated alkyl group.

$R^{52}$ is a hydrogen atom, a hydroxyl group, a halogen atom, a straight-chain or branched-chain alkyl group, a straight-chain or branched-chain halogenated alkyl group, or a straight-chain or branched-chain alkoxy group.

Examples of the halogen atom as $R^{52}$ include a fluorine atom, a bromine atom, a chlorine atom, and an iodine atom, and among these, a fluorine atom is preferred.

The alkyl group as $R^{52}$ is straight-chain or branched-chain, and preferably has 1 to 5 carbon atoms, more preferably 1 to 4 carbon atoms, and still more preferably 1 to 3 carbon atoms.

The straight-chain or branched-chain halogenated alkyl group as $R^{52}$ is a group in which at least one or all of the hydrogen atoms of the alkyl group have been substituted with fluorine atoms. Herein, examples of the alkyl group include the same "alkyl groups" mentioned above as $R^{52}$. Examples of the substituting halogen atoms include the same as those mentioned above in the description of the "halogen atom" as $R^{52}$. For the halogenated alkyl group, it is preferable that 50 to 100% of the total hydrogen atoms be substituted with halogen atoms, and it is more preferable that all of the total hydrogen atoms be substituted with halogen atoms.

The alkoxy group as $R^{52}$ is straight-chain or branched-chain, and preferably it has 1 to 5 carbon atoms, more preferably 1 to 4 carbon atoms, and still more preferably 1 to 3 carbon atoms.

Among these, a hydrogen atom is preferred as $R^{52}$.

$R^{53}$ is an aryl group that may have a substituent, and examples of the structure of its basic ring in which the substituent is excluded include a naphthyl group, a phenyl group, and an anthracenyl group, and among these, a phenyl group is preferred, from the viewpoints of the effect of the present invention, or absorption of exposure light of an ArF excimer laser, etc.

Examples of the substituent include a hydroxyl group, and a lower alkyl group (which is straight-chained or branched-chain, and preferably has 1 or more and 5 or less carbon atoms, and among these, a methyl group is particularly preferred).

The aryl group of $R^{53}$ further preferably has no substituent.

u" is an integer of 1 to 3, preferably 2 or 3, and particularly preferably 3.

Preferable examples of the acid generator represented by the general formula (b-0) are as follows.

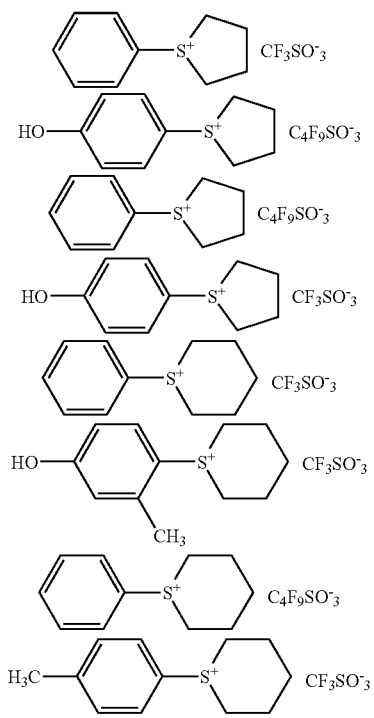

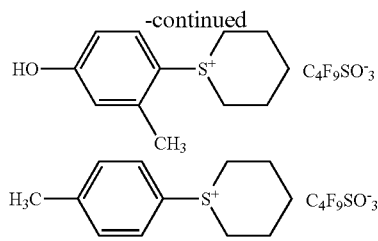

Further, examples of other onium salt-based acid generators as the acid generator represented by the general formula (b-0) include the compound represented by the following general formula (b-1) or (b-2);

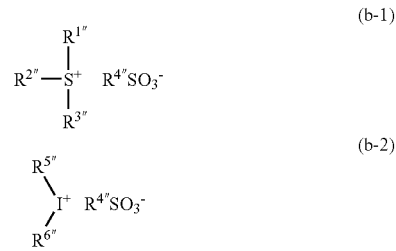

[In the above formula, $R^{1"}$ to $R^{3"}$, and $R^{5"}$ to $R^{6"}$ each independently represents an aryl group or an alkyl group; $R^{4"}$ represents a straight-chain, branched or cyclic alkyl group, or a fluorinated alkyl group; at least one of $R^{1"}$ to $R^{3"}$ represents an aryl group; and at least one of $R^{5"}$ to $R^{6"}$ represents an aryl group.]

In the formula (b-1), $R^{1"}$ to $R^{3"}$ each independently represents an aryl group or an alkyl group. At least one of $R^{1"}$ to $R^{3"}$ represents an aryl group. It is preferable that at least two of $R^{1"}$ to $R^{3"}$ be aryl groups, and it is most preferable that all of $R^{1"}$ to $R^{3"}$ be aryl groups.

The aryl groups of $R^{1"}$ to $R^{3"}$ are not particularly limited, and examples thereof include an aryl group having 6 to 20 carbon atoms. In the aryl group, at least one or all of the hydrogen atoms may or may not be substituted with an alkyl group, an alkoxy group, a halogen atom, etc. As the aryl group, an aryl group having 6 to 10 carbon atoms is preferred, in view of inexpensive synthesis. Specific examples thereof include a phenyl group, and a naphthyl group.

As the alkyl group that may substitute the hydrogen atom of the aryl group, an alkyl group having 1 to 5 carbon atoms is preferred, and a methyl group, an ethyl group, a propyl group, an n-butyl group, or a tert-butyl group is most preferred.

As the alkoxy group that may substitute the hydrogen atom of the aryl group, an alkoxy group having 1 to 5 carbon atoms is preferred, and a methoxy group or an ethoxy group is most preferred.

As the halogen atom that may substitute the hydrogen atom of the aryl group, a fluorine atom is preferred.

The alkyl group of $R^{1"}$ to $R^{3"}$ is not particularly limited, and examples thereof include a straight-chain, branched or cyclic alkyl group having 1 to 10 carbon atoms. It is preferable that the alkyl group have 1 to 5 carbon atoms, in view of excellent resolution. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group, and among these, a methyl group is preferred, in view of excellent resolution and inexpensive synthesis.

Among these, it is most preferred that each of $R^{1''}$ to $R^{3''}$ be a phenyl group or a naphthyl group.

$R^{4''}$ represents a straight-chain, branched or cyclic alkyl group or fluorinated alkyl group.

The straight-chain or branched alkyl group preferably has 1 to 10 carbon atoms, more preferably 1 to 8 carbon atoms, and most preferably 1 to 4 carbon atoms.

The cyclic alkyl group may be a cyclic group represented by the aforementioned $R^{1''}$, and preferably has 4 to 15 carbon atoms, more preferably 4 to 10 carbon atoms carbon atoms, and most preferably 6 to 10 carbon atoms.

The fluorinated alkyl group preferably has 1 to 10 carbon atoms, more preferably 1 to 8 carbon atoms, and most preferably 1 to 4 carbon atoms. The fluorination rate of the fluorinated alkyl group (the proportion of the fluorine atoms in the alkyl group) is preferably 10% to 100%, still more preferably 50% to 100%, and particularly those in which all of the hydrogen atoms have been substituted with fluorine atoms, thus giving strong acidity, are preferred.

As $R^{4''}$, a straight-chain or cyclic alkyl group, or a fluorinated alkyl group is most preferred.

In the formula (b-2), $R^{5''}$ to $R^{6''}$ each independently represents an aryl group or an alkyl group. At least one of $R^{5''}$ to $R^{6''}$ represents an aryl group. Preferably, all of $R^{5''}$ to $R^{6''}$ are aryl groups.

Examples of the aryl group of $R^{5'}$ to $R^{6''}$ include the same as those mentioned for the aryl group of $R^{1''}$ to $R^{3''}$.

Examples of the alkyl group of $R^{5''}$ to $R^{6''}$ include the same as those mentioned for the alkyl group of $R^{1''}$ to $R^{3''}$.

Among these, it is most preferable that all of $R^{5''}$ to $R^{6''}$ be phenyl groups, Examples of $R^{4''}$ in the formula (b-2) include the same as those mentioned for $R^{4''}$ in the formula (b-1).

Specific examples of the onium salt-based acid generator represented by the formula (b-1) or (b-2) include diphenyliodonium trifluoromethanesulfonate or nonafluorobutanesulfonate, bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyldiphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; and the like. Also, the onium salts in which the anionic part has been substituted with methanesulfonate, n-propanesulfonate, n-butanesulfonate, or n-octanesulfonate can be used.

Further, in the general formula (b-1) or (b-2), the onium salt-based acid generator in which in the anionic part has been substituted with the anionic part represented by the following general formula (b-3) or (b-4) can also be used (the cationic part is the sane as for (b-1) or b-2)).

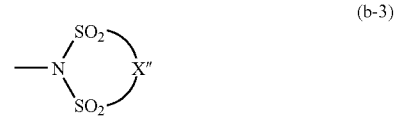

(b-3)

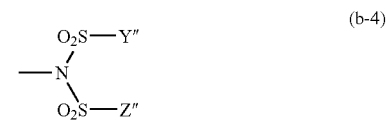

(b-4)

[In the above formula, X" represents an alkylene group having 2 to 6 carbon atoms in which at least one hydrogen atom has been substituted with a fluorine atom; and Y" and Z" each independently represents an alkyl group having 1 to 10 carbon atoms in which at least one hydrogen atom has been substituted with a fluorine atom.]

X" is a straight-chain or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Y" and Z" are each independently a straight-chain or branched alkyl group in which at least one hydrogen atom has been substituted with a fluorine atom, and the alkyl group has 1 to 10 carbon atoms, preferably 1 to 7 carbon atoms, and most preferably 1 to 3 carbon atoms.

It is preferable that the alkylene group of X", or the alkyl group of Y" and Z" have a smaller number of carbon atoms with the above-described range, in view of good solubility in a resist solvent.

Further, it is preferable that the alkylene group of X", or the alkyl group of Y" and Z" have a larger number of the hydrogen atoms substituted with fluorine atoms in view of stronger acidity and higher transparency to an electron beam or a high-energy light at 200 nm or less. The proportion of the fluorine atoms in the alkylene group or alkyl group, that is, the fluorination rate is preferably 70% to 100%, still more preferably 90% to 100%, and a perfluoroalkylene group or perfluoroalkyl group in which au of the hydrogen atoms are substituted with fluorine atoms, is particularly preferred.

As used in the present invention, the oxime sulfonate-based acid generator is a compound having at least one group represented by the following general formula (B-1), which is characterized by generation of an acid upon irradiation with radiation. The oxime sulfonate-based acid generator is widely used for a chemically amplified resist composition, and thus can be optionally selected and used.

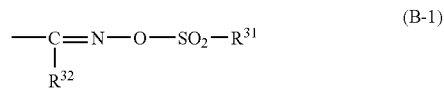

(B-1)

[In the above formula, $R^{31}$ and $R^{32}$ each independently represents an organic group.]

The organic group of $R^{31}$ and $R^{32}$ is a carbon atom-containing group, aid may contain atoms other than the carbon atom (for example, a hydrogen atom, an oxygen atom, a nitrogen atom, a sulfur atom, and a halogen atom (such as a fluorine atom, and a chlorine atom)).

The organic group of $R^{31}$ is preferably a straight-chained, branched, or cyclic alkyl group or an aryl group. The alkyl group or the aryl group may have a substituent. The substituent is not particularly limited, and examples thereof include a fluorine atom, and a straight-chained, branched, or cyclic alkyl group having 1 to 6 carbon atoms. As used herein, the expression "having a substituent" means that at least one or all of the hydrogen atoms of the alkyl group or the aryl group are substituted with substituents.

The alkyl group preferably has 1 to 20 carbon atoms, more preferably 1 to 10 carbon atoms, still more preferably 1 to 8 carbon atoms, particularly preferably 1 to 6 carbon atoms, and most preferably 1 to 4 carbon atoms. The alkyl group is particularly preferably a partially or completely halogenated alkyl group (sometimes referred to as a halogenated alkyl group, hereinafter). The partially halogenated alkyl group refers to an alkyl group in which at least one of the hydrogen atoms are substituted with halogen atoms, and the completely halogenated alkyl group refers to an alkyl group in which all of the hydrogen atoms are substituted with halogen atoms. Examples of the halogen atom include a fluorine atom, a chlorine atom, a bromine atom, and an iodine atom. It is particularly preferably a fluorine atom. That is, the halogenated alkyl group is preferably a fluorinated alkyl group.

The aryl group preferably has 4 to 20 carbon atoms, more preferably 4 to 10 carbon atoms, and most preferably 6 to 10 carbon atoms. The aryl group is particularly preferably a partially or completely halogenated aryl group. Further, the partially halogenated aryl group refers to an aryl group in which at least one of the hydrogen atoms are substituted with halogen atoms, and the completely halogenated aryl group refers to an aryl group in which all of the hydrogen atoms are substituted with halogen atoms.

$R^{31}$ is particularly preferably an unsubstituted alkyl group having 1 to 4 carbon atoms, or a fluorinated alkyl group having 1 to 4 carbon atoms.

The organic group of $R^{32}$ is preferably a straight-chain, branched, or cyclic alkyl group, an aryl group, or a cyano group. Examples of the alkyl group and the aryl group of $R^{32}$ include those as mentioned for the alkyl group and the aryl group of $R^{31}$.

As $R^{32}$, an unsubstituted alkyl group having 1 to 8 carbon atoms, or a fluorinated alkyl group having 1 to 8 carbon atoms is particularly preferred.

More preferable examples of the oxime sulfonate-based acid generator include a compound represented by the following general formula (B-2) or (B-3),

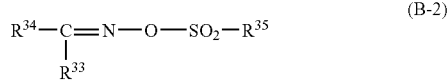

(B-2)

[In the above formula (B-2), $R^{33}$ represents a cyano group, an unsubstituted alkyl group, or a halogenated alkyl group; $R^{34}$ represents an aryl group; and $R^{35}$ represents an unsubstituted alkyl group or halogenated alkyl group.]

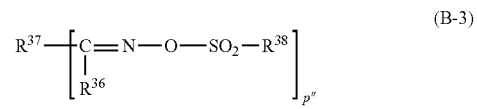

(B-3)

[In the above formula (B-3), $R^{36}$ represents a cyano group, an unsubstituted alkyl group, or a halogenated alkyl group; $R^{37}$ represents a divalent or trivalent aromatic hydrocarbon group; $R^{38}$ represents an unsubstituted alkyl group or halogenated alkyl group; and p" represents 2 or 3.]

In the general formula (B-2), the unsubstituted alkyl group or halogenated alkyl group of $R^{33}$ preferably has 1 to 10 carbon atoms, more preferably 1 to 8 carbon atoms, and most preferably 1 to 6 carbon atoms.

$R^{33}$ is preferably a halogenated alkyl group, and more preferably a fluorinated alkyl group.

The fluorinated alkyl group of $R^{33}$ is preferably one in which 50% or more of the hydrogen atoms of the alkyl group are fluorinated, more preferably one in which 70% or more of the hydrogen atoms of the alkyl group are fluorinated, and most preferably one in which 90% or more of the hydrogen atoms of the alkyl group are fluorinated.

Examples of the aryl group of $R^{34}$ include a group in which one hydrogen atom has been removed from the ring of an aromatic hydrocarbon such as a phenyl group, a biphenyl group, a fluorenyl group, a naphthyl group, an anthracyl group, and a phenanthryl group; and a heteroaryl group in which at least one of the oxygen atoms constituting those rings are substituted with heteroatoms such as an oxygen atom, a sulfur atom, and a nitrogen atom. Among these, a fluorenyl group is preferred.

The aryl group of $R^{34}$ may have a substituent such as an alkyl group having 1 to 10 carbon atoms, a halogenated alkyl group, and an alkoxy group. The alkyl group or the halogenated alkyl group as the substituent preferably has 1 to 8 carbon atoms, and more preferably 1 to 4 carbon atoms. Further, the halogenated alkyl group is preferably a fluorinated alkyl group.

The unsubstituted alkyl group or halogenated alkyl group of $R^{35}$ preferably has 1 to 10 carbon atoms, more preferably 1 to 8 carbon atoms, and most preferably 1 to 6 carbon atoms.

$R^{35}$ is preferably a halogenated alkyl group, more preferably a fluorinated alkyl group, and most preferably a partially or completely fluorinated alkyl group.

The fluorinated alkyl group of $R^{35}$ is preferably one in which 50% or more of the hydrogen atoms of the alkyl group are fluorinated, more preferably one in which 70% or more of the hydrogen atoms of the alkyl group are fluorinated, and most preferably one in which 90% or more of the hydrogen atoms of the alkyl group are fluorinated, thus giving higher acidity of an acid generated. Most preferably, it is one in which 100% of the hydrogen atoms of the alkyl group are completely fluorinated.

In the general formula (B-3), examples of the unsubstituted alkyl group or halogenated alkyl group of $R^{36}$ include the same as the unsubstituted alkyl group or the halogenated alkyl group of $R^{33}$.

Examples of the divalent or trivalent aromatic hydrocarbon group of $R^{37}$ include a group in which one or two hydrogen atoms have been removed from the aryl group of $R^{34}$.

Examples of the unsubstituted alkyl group or halogenated alkyl group of $R^{38}$ include the same as those described above for the unsubstituted alkyl group or halogenated alkyl group of $R^{35}$.

p" preferably represents 2.

Specific examples of the oxime sulfonate-based acid generator include α-(p-toluenesulfonyloxyimino)-benzylcyanide, α-(p-chlorobenzenesulfonyloxyimino)-benzylcyanide, α-(4-nitrobenzenesulfonyloxyimino)-benzylcyanide, α-(4-nitro-2-trifluoromethylbenzenesulfonyloxyimino)-benzylcyanide, α-(benzenesulfonyloxyimino)-4-chlorobenzylcyanide, α-(benzenesulfonyloxyimino)-2,4-dichlorobenzylcyanide, α-(benzenesulfonyloxyimino)-2,6-dichlorobenzylcyanide, α-(benzenesulfonyloxyimino)-4-methoxybenzylcyanide, α-(2-chlorobenzenesulfonyloxyimino)-4-methoxybenzylcyanide, α-(benzenesulfonyloxyimino)-thien-2-ylacetonitrile, α-(4-dodecylbenzenesulfonyloxyimino)-benzylcyanide, α-[p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienylcyanide, α-(methylsulfonyloxyimino)-1-cyclopentenylacetonitrile, α-(methylsulfonyloxyimino)-1-cyclohexenylacetonitrile, α-(methylsulfonyloxyimino)-1-cycloheptenylacetonitrile, α-(methylsulfonyloxyimino)-1-cyclooctenylacetonitrile, α-(trifluoromethylsulfonyloxyimino)-1-cyclopentenylacetonitrile, α-(trifluoromethylsulfonyloxyimino)-cyclohexylacetonitrile, α-(ethylsulfonyloxyimino)-ethylacetonitrile, α-propylsulfonyloxyimino)-propylacetonitrile, α-(cyclohexylsulfonyloxyimino)-cyclopentylacetonitrile, α-(cyclohexylsulfonyloxyimino)-cyclohexylacetonitrile, α-(cyclohexylsulfonyloxyimino)-1-cyclopentenylacetonitrile, α-(ethylsulfonyloxyimino)-1-cyclopentenylacetonitrile, α-(isopropylsulfonyloxyimino)-1-cyclopentenylacetonitrile, α-(n-butylsulfonyloxyimino)-1-cyclopentenylacetonitrile, α-(ethylsulfonyloxyimino)-1-cyclohexenylacetonitrile, α-(isopropylsulfonyloxyimino)-1-cyclohexenylacetonitrile, α-(n-butylsulfonyloxyimino)-1-cyclohexenylacetonitrile, α-(methylsulfonyloxyimino)-phenylacetonitrile, α-(methylsulfonyloxyimino)-p-methoxyphenylacetonitrile, α-(trifluoromethylsulfonyloxyimino)-phenylacetonitrile, α-(trifluoromethylsulfonyloxyimino)-p-methoxyphenylacetonitrile, α-(ethylsulfonyloxyimino)-p-methoxyphenylacetonitrile, α-(propylsulfonyloxyimino)-p-methylphenylacetonitrile, and α-(methylsulfonyloxyimino)-p-bromophenylacetonitrile.

In addition, the oxime sulfonate-based acid generators as disclosed in Japanese Unexamined Patent Application, First Publication No. H09-208554 (see Paragraphs 0012 to 0014, Chemical Formulas 18 to 19), and the oxime sulfonate-based acid generators as disclosed in WO2004/074242 A2 (see pp. 65 to 85, Examples 1 to 40) can also be suitably used.

Further, examples of suitable oxime sulfonate-based acid generators include the following compounds.

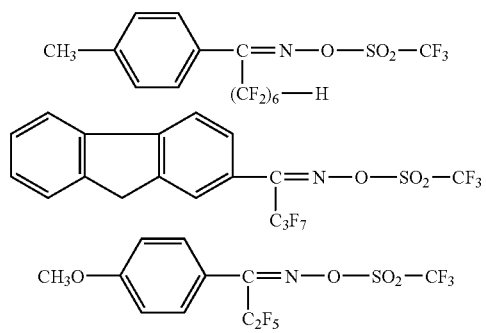

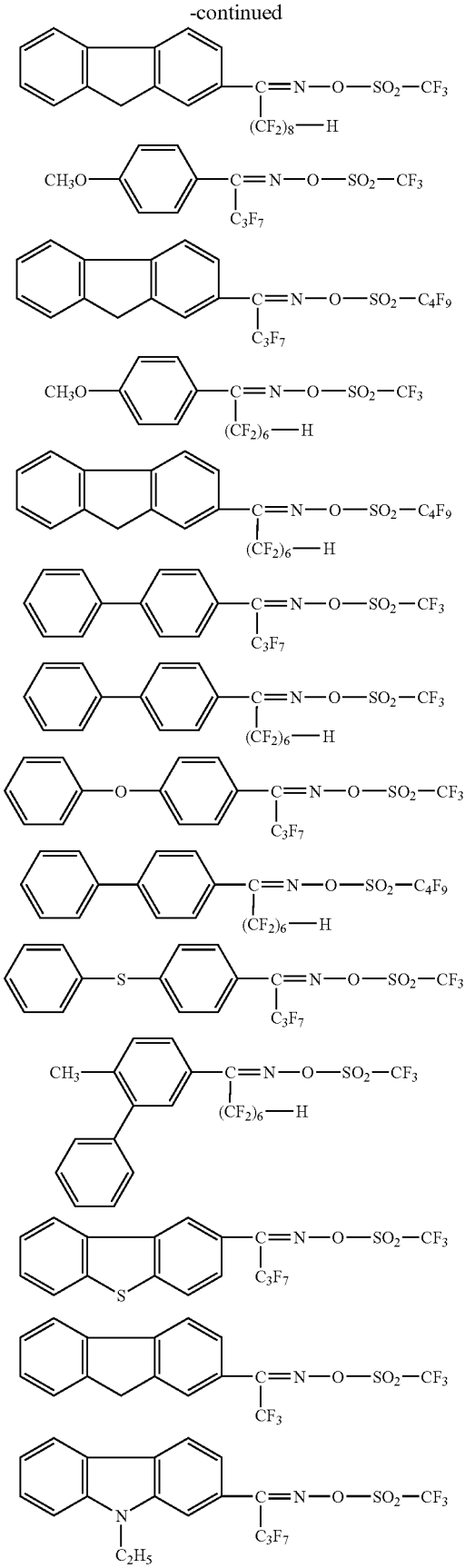

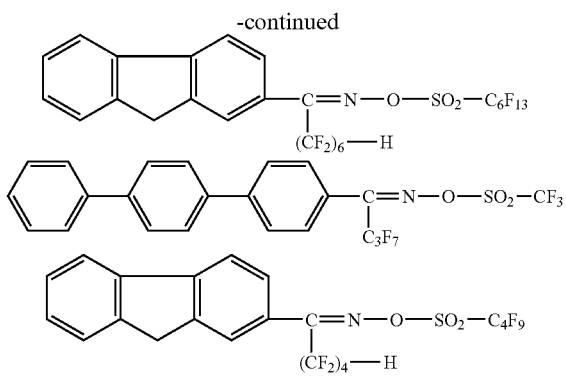

More preferable examples of the oxime sulfonate-based acid generator include the following four compounds are preferred.

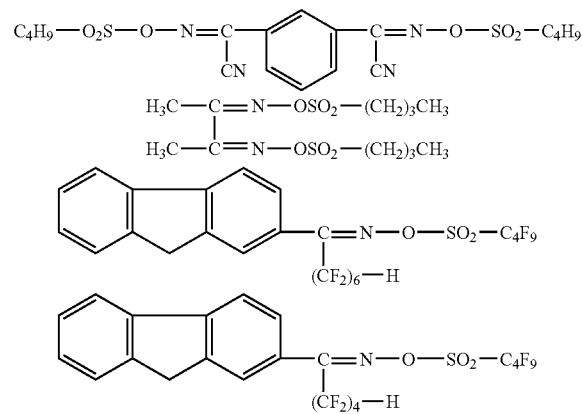

Among the diazomethane-based acid generators, specific examples of bisalkyl or bisarylsulfonyl diazomethanes include bis(isopropylsulfonyl) diazomethane, bis(p-toluenesulfonyl) diazomethane, bis(1,1-dimethylethylsulfonyl) diazomethane, bis(cyclohexylsulfonyl) diazomethane, and bis (2,4-dimethylphenylsulfonyl) diazomethane.

Further, the diazomethane-based acid generators as disclosed in Japanese Unexamined Patent Application, First Publication Nos. H11-035551, H11-035552, and H11-035573 can also be suitably used.

In addition, examples of the poly(bissulfonyl) diazomethanes include 1,3-bisphenylsulfonyldiazomethylsulfonyl)propane, 1,4-bis(phenylsulfonyldiazomethylsulfonyl)butane, 1,6-bisphenylsulfonyldiazomethylsulfonyl)hexane, 1,10-bisphenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, as disclosed in Japanese Unexamined Patent Application, First Publication No, H11-322707.

As the component (B), the acid generator may be used alone or in a combination of two or more kinds thereof.

In the present invention, as the component (B), an onium salt having a fluorinated alkylsulfonic acid ion as an anion is preferably used.

The content of the component (B) in a positive resist composition for immersion lithography of the present invention is 0.5 to 30 parts by mass, and preferably 1 to 10 parts by mass, relative to 100 parts by mass of the component (A). If the quantity is within the above range, the pattern formation is sufficiently performed. Further, a uniform solution can be obtained, and storage stability is better. Accordingly, the range is considered preferable.

<Optional Component>

The positive resist composition for immersion lithography of the present invention can her include a nitrogen-containing organic compound (D) (referred to as the component (D), hereinafter) as an optional component, in order to improve the shape of the resist pattern and the post exposure stability of the latent image formed by the pattern-wise exposure of the resist layer, etc.

A multitude of these nitrogen-containing organic compounds have already been proposed as the component (D), and any of these known compounds can be optionally used. Among these, an aliphatic amine is preferred, and a secondary aliphatic amine or tertiary aliphatic amine is particularly preferred. As used herein, the aliphatic amine refers to amine having at least one aliphatic group, and the aliphatic group preferably has 1 to 12 carbon atoms.

Examples of the aliphatic amine include an amine in which at least one hydrogen atom of ammonia, $NH_3$, is substituted with an alkyl group or hydroxyalkyl group having 1 or more and 12 or less carbon atoms (i.e. alkyl amine or alkyl alcohol amine).

Examples thereof include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, tri-n-dodecylamine; and alkyl alcohol amines such as diethanolamine, triethanolamine, diisopropanolamine, triisopropanolamine, di-n-octanolamine, and tri-n-octanolamine.

Among these, alkyl alcohol amines and trialkylamines are preferred, and alkyl alcohol amines are most preferred.

Among trialkylamines, triethanolamine and triisopropanolamine are most preferred.

Examples of the cyclic amine include a heterocyclic compound containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo [2.2.2]octane.

The component (D) may be used alone, or in a combination of two or more kinds thereof.

The component (D) is used in an amount within a range from usually 0.01 to 5.0 parts by mass, relative to 100 parts by mass of the component (A).

The positive resist composition for immersion lithography of the present invention can her include at least one compound (E) selected from the group consisting of an organic carboxylic acid, and a phosphorus oxo acid and derivatives thereof (referred to as the component (E), hereinafter) as another optional component, in order to prevent any deterioration in sensitivity, and to improve the resist pattern shape and the post exposure stability of the latent image formed by the pattern-wise exposure of the resist layer, etc.

Preferable examples of the organic carboxylic acid include acetic acid, malonic acid, citric acid, malic acid, succinic acid, benzoic acid, and salicylic acid.

Examples of the phosphorus oxo acid and derivatives thereof include phosphoric acid, phosphonic acid, and phosphinic acid, and among these, phosphonic acid is particularly preferred.

Examples of the derivatives of the phosphorus oxo acid include an ester in which a hydrogen atom of the oxo acid has been substituted with a hydrocarbon group, and examples of the hydrocarbon group include an alkyl group having 1 to 5 carbon atoms, and an aryl group having 6 to 15 carbon atoms.

Examples of the derivative of the phosphoric acid include a phosphoric acid ester such as di-n-butyl phosphate and diphenyl phosphate.

Examples of the derivative of the phosphonic acid include a phosphonic acid ester such as dimethyl phosphonate, di-n-butyl phosphonate, phenylphosphonic acid, diphenyl phosphonate, and dibenzyl phosphonate.

Examples of the derivative of the phosphinic acid include a phosphinic acid ester of phenylphosphinic acid, etc.

The component (E) may be used alone or in a combination of two or more kinds thereof.

The component (E) is typically used in an amount within a range from 0.01 to 5.0 parts by mass, relative to 100 parts by mass of the component (A).

Miscible additives such as an additional resin for improving the performances of a resist film, a surfactant for improving the applicability, a dissolution inhibitor, a plasticizer, a stabilizer, a colorant, a halation prevention agent, and a dye can also be further added to the positive resist composition for immersion lithography of the present invention according to need.

The positive resist composition for immersion lithography of the present invention can be produced by dissolving the above-described materials in an organic solvent (referred to as the component (S), hereinafter).

The component (S) may be any solvent capable of dissolving various components to generate a uniform solution, and one, or two or more solvents selected from known materials that are used as the solvents for conventional chemically amplified resists can be suitably selected and used.

Examples of the component (S) include lactones such as γ-butyrolacetone; ketones such as acetone, methyl ethyl ketone, cyclohexanone, methyl-n-amylketone, methyl isoamyl ketone and 2-heptanone; polyhydric alcohols or derivatives thereof such as ethylene glycol, diethylene glycol, propylene glycol, and dipropylene glycol; the derivatives of polyhydric alcohols, including ester bond-containing compounds such as ethylene glycol monoacetate, diethylene glycol monoacetate, propylene glycol monoacetate, and dipropylene glycol monoacetate, and ether bond-containing compounds such as monoalkyl ethers and monophenyl ethers of the above-described polyhydric alcohols or ester bond-containing compounds, in which the monoalkyl ethers includes monomethyl ether, monoethyl ether, monopropyl ether, and monobutyl ether; cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethyl benzyl ether, cresyl methyl ether, diphenyl ether, dibenzyl ether, phenetole, butyl phenyl ether, ethylbenzene, diethylbenzene, amylbenzene, isopropylbenzene, toluene, xylene, cymene, and mesitylene.

These organic solvents can be used alone, or as a mixed solvent of two or more kinds thereof. Among these, propylene glycol monomethyl ether acetate (PGMEA), propylene glycol monomethyl ether (PGME), and EL are preferred.

Further, a mixed solvent of propylene glycol monomethyl ether acetate, PGMEA, and a polar solvent is preferred. In this case, the blending ratio (mass ratio) of PGMEA to the polar solvent is suitably determined based on the compatibility between PGMEA and the polar solvent, but it is preferably within a range from 1:9 to 9:1, and more preferably from 2:8 to 8:2.

Specifically, in the case where EL is added as the polar solvent the mass ratio of PGMEA:EL is preferably within a range from 1:9 to 91, and more preferably from 2:8 to 8:2. Further, in the case where PGME is added as the polar solvent the mass ratio of PGMEA:PGME is preferably within a range from 1:9 to 9:1, more preferably from 2:8 to 8:2, and even more preferably 3:7 to 7:3.

Furthermore, as the component (S), a mixed solvent of at least one selected from PGMEA and EL, and γ-butyrolactone, is also preferred. In such cases, the mass ratio of the former and latter components in the mixed solvent is preferably within a range from 70:30 to 95:5.

The quantity of the component (S) used is not particularly limited, but it is suitably selected according to the applied film thickness at a concentration which allows application to a substrate. Generally, the amount of the organic solvent is used in an amount such that the solid concentration of the resist composition is in the range of from 2 to 20 mass %, and preferably from 5 to 15 mass %.

Dissolution of materials in the component (S) can be carried out simply by mixing and stirring each of the above-described components by a conventional method. Further, if necessary, the components may be dispersed and mixed by means of a dispersion machine such as a dissolver, a homogenizer, and a triple roll mill, further optionally followed by filtration using a mesh filter, a membrane filter, or the like.

Using a positive resist composition for immersion lithography according to the present invention, a resist film with a highly hydrophobic surface can be formed as described above. Moreover, the lithography properties are good, and a resist pattern can be formed without practical problems when the present invention is used as a resist in immersion lithography.

The reason why the aforementioned effects can be obtained is not clear. However, the resin (A1) has the cyclic main chain structure containing a fluorine atom and no acid-dissociable group, and the resin (A2) has the acrylic structure containing no fluorine atom. Therefore, when such a positive resist composition for immersion lithography is used to form a resist film, it is speculated that the resins (A1) with comparatively high hydrophobicity are distributed in the vicinity of the outside surface of the resist film and the resins (A2) with comparatively high hydrophilicity are distributed in the vicinity of the inside surface of the resist film. It is speculated that, because the resins (A1) are distributed in the vicinity of the outside surface of the resist film, the hydrophobicity of the obtained resist film (that is, an receding angle is increased, and a sliding angle is decreased) is improved in comparison with the case where the resin (A2) is used alone. In addition, it is speculated that, because the resins (A2) are distributed inside the resist film, favorable lithography properties are ensured.

When the immersion exposure step is performed, the elution of the components of the resist film into an immersion medium (material elution) is inhibited. Accordingly, the aforementioned resist film is excellent in immersion medium resistance, and is preferred for immersion lithography.

In other words, in the resist film formed using a positive resist composition for immersion lithography of the present invention, the contact angles with respect to water and the sliding angle are changed in comparison with the case where the resin (A2) is used alone as the component (A). For example, the contact angle is increased, whereas the sliding angle is decreased. The contact angles include a static contact angle (an angle formed by the surface of a water droplet on the resist film in a horizontal situation and the surface of the resist film) and a dynamic contact angle (a contact angle when a water drop starts to slide by inclining a resist film; the dynamic contact angle includes a contact angle at the forward end point in the sliding direction (an advancing angle) and a contact angle at the backward end point in the sliding direction (a receding angle).). The sliding angle refers to an inclination degree of a resist film when a water drop starts to slide by inclining the resist film.

In immersion lithography, as described above, a resist film contacts an immersion medium such as water during immersion exposure. Therefore, it is speculated that material elution is affected by the properties of the surface of a resist film (for example, hydrophilicity or hydrophobicity).

In the present invention, the hydrophobicity of the film surface is improved by using the specific component (A), and therefore, the inhibition effect of the material elution is also improved. According to our speculation, this is because, by improving the hydrophobicity of the film surface, an immersion medium is likely to be repelled from the film surface and the contact area and contact time can be reduced so as to reduce the influence of the immersion medium. For example, when an immersion medium is removed after an immersion exposure, the immersion medium can be immediately removed from the surface of the resist film.

As used herein, the receding angle refers to an angle $\theta_1$ between an upper part $1a$ of a liquid drop 1 and a flat surface 2 on which the liquid drop 1 has been placed, when the liquid drop 1 starts to move (drop) on the flat surface 2 by gradually inclining the flat surface 2 as shown in FIG. 1. The sliding angle refers to an inclination degree $\theta_2$ of the flat surface 2 when the liquid drop 1 starts to move (drop) on the flat surface 2.

As used in the present specification, the receding angle and the sliding angle are measured in the following manner.

First, a resist composition solution is spin-coated on a 6 inch silicone substrate, and then heated at a temperature of 90° C. for 90 seconds to form a resist film.

Thereafter, measurements for the resulting resist film can be conducted by means of a commercially available measurement apparatus such as AUTO SLIDING ANGLE: SA-30 DM (manufactured by Kyowa Interface Science Co. Ltd.) or AUTO DISPENSER: AD-31 (manufactured by Kyowa Interface Science Co. Ltd.).

The positive resist composition for immersion lithography of the present invention preferably has a receding angle of 55° or more, more preferably 55° to 150°, particularly preferably 55 to 130°, and most preferably 60° to 100°, as measured for the resist film obtained by using the resist composition. When the receding angle is 55° or more, the hydrophobicity of the surface of the resist film is good, and the inhibition effect of the material elution is improved. When the receding angle is 150° or less, the lithography properties are good.

Moreover, the positive resist composition for immersion lithography of the present invention preferably has a sliding angle of 36° or less, more preferably 30° or less, particularly preferably 25° or less, and most preferably 20° or less, as measured for the resist film obtained by using the resist composition. When the sliding angle is 36° or less, the inhibition effect of the material elution during immersion exposure is improved. Also, a sliding angle is preferably 10° or more, more preferably 12° or more, and particularly preferably 15° or more. When the sliding angle is 10° or more, the lithography properties are good.

The levels of the receding angle and the sliding angle can be adjusted by changing the composition of the positive resist composition for immersion lithography, such as the mixture ratio of the resin (A1) and the resin (A2) in the component (A) or the proportions of the respective structural units such as the structural unit (a3). For example, when the proportion of the resin (A1) within the component (A) is set to 1 mass % or more, the receding angle becomes much larger, and the sliding angle becomes smaller, in comparison with the case where the resin (A2) is used alone.

Furthermore, in the present invention, the material elution into the liquid immersion solvent is inhibited, as described above. Thus, the change in quality of resist films and the change in refractive indices of the liquid immersion solvents can be inhibited. Accordingly, by inhibiting the change in refractive indices of liquid immersion solvents, undulation and line edge roughness (unevenness of the side wall of the pattern) can be reduced in the formed resist pattern, and lithography properties such as shape become good. In addition, the contamination of lens of an exposure apparatus can be reduced, which in turn eliminates the need for a means for protecting them from deterioration, and contributes to simplification of the process or the exposure apparatus.

According to a positive resist composition for immersion lithography of the present invention, it is possible to form a resist pattern with high resolution, for example a resist pattern with a size of 120 nm or less.

Also, by using a positive resist composition for immersion lithography of the present invention, it is possible to form a resist pattern with a good shape, in which foreign matters and the generation of developing defects are suppressed.

Moreover, in a positive resist composition for immersion lithography of the present invention, the resin (A1) that is used as the component (A) does not contain an acid-dissociable group. Therefore, the present invention has the advantageous effects such as easy synthesis and inexpensive availability in comparison with resins that have generally been used as a base resin of a positive resist composition (a resin containing an acid-dissociable, dissolution-inhibiting group).

<<Method for Forming Resist Pattern>>

Hereinafter, the method for forming a resist pattern of the present invention is described.

The method for forming the positive resist pattern of the present invention includes forming a resist film on a substrate using a resist composition for immersion lithography of the present invention; conducting immersion exposure of the resist film; and developing the resist film to form a resist pattern.

One preferable embodiment of the method for forming a resist pattern of the present invention is described below.

First, the positive resist composition for immersion lithography of the present invention is applied onto the surface of a substrate such as a silicon wafer by using a spinner or the like, and then subjected to pre-baking (post applied bake (PAB) treatment) to form a resist film.

At this time, an organic or inorganic anti-reflective film may also be provided between the substrate and the applied layer of the resist composition, to thereby produce a double-layer laminate.

Moreover, an organic anti-reflective film may also be provided on the resist film, to thereby produce a double-layer laminate. In addition, an underlying anti-reflective film may also be provided thereto, to thereby produce a triple-layer laminate.

An anti-reflective film to be provided on the resist film is preferably soluble in an alkali developing solution.

The above-described processes can be carried out by using a well-known method. Preferably, the operating condition, etc. is suitably adjusted according to the composition and the characteristics of the used positive resist composition for immersion lithography.

Next, the obtained resist film is subjected to selective immersion lithography (Liquid Immersion Lithography) through a desired mask pattern. At this time, a solvent (immersion medium) having a higher refractive index than that of air is preliminarily filled between the resist film and a bottom lens of an exposure apparatus, and then exposure (immersion exposure) is carried out in such a state.

The wavelength used for exposure is not particularly limited, and exposure can be carried out using radiation such as an ArF excimer laser, a KrF excimer laser, and an $F_2$ laser. A resist composition of the present invention is effective for a KrF or an ArF excimer laser, and particularly an ArF excimer laser.

As described above, in a formation method of the present invention, during exposure, an immersion medium is filled between the resist film and a bottom lens of an exposure apparatus, and then exposure (immersion exposure) is carried out in such a state.

As the immersion medium to be used, a solvent which has a higher refractive index than that of air, and a lower refractive index than that of a resist film formed by using the positive resist composition for immersion lithography is preferred. The refractive index of the solvent is not particularly limited, as long as it is within the above-described range.

Examples of the solvent which has a higher refractive index than that of air, and a lower refractive index than that of a resist film include water, a fluorine-based inactive liquid, a silicone-based solvent, and a hydrocarbon-based solvent.

Specific examples of the fluorine-based inactive liquid include a liquid having a fluorine-based compound such as $C_3HCl_2F_5$, $C_4F_9OCH_3$, $C_4F_9OC_2H_5$, and $C_5H_3F_7$ as a main component. Among these, those having a boiling point of 70° C. to 180° C. are preferred, and those having a boiling point of 80° C. to 160° C. are more preferred. If the fluorine-based inactive liquid has a boiling point in the above-described range, the removal of the medium used for liquid immersion after completion of exposure can be carried out by a simple method, thereby it being preferable.

As the fluorine-based inactive liquid, a perfluoroalkyl compound in which all of the hydrogen atoms of an alkyl group have been substituted with fluorine atoms is particularly preferred. Specific examples of the perfluoroalkyl compound include a perfluoroalkyl ether compound and a perfluoroalkylamine compound.

Further, specific examples of the perfluoroalkyl ether compound include perfluoro(2-butyl-tetrahydrofuran) (boiling point: 102° C.), and examples of the perfluoroalkylamine compound include perfluorotributylamine (boiling point: 174° C.).

In particular, the positive resist composition for immersion lithography of the present invention is substantially not interfered with by water, and has excellent sensitivity, and shape of a resist pattern profile. As a result, water is preferably used as a solvent that has a larger refractive index than the refractive index of air. In addition, water is preferred from viewpoints of cost, safety, environmental concern, and a diversity of uses.

Then, after completion of the immersion exposure step, post exposure baking (PEB) is conducted, and then development using an alkali developer including an aqueous alkaline solution is conduced. Further, water rinsing is conducted preferably with pure water. Water rinsing can be carried out, for example, by dropping or spraying water onto the surface of the substrate while rotating the substrate, and washing out the developer on the substrate and the positive resist composition for immersion lithography dissolved by the developer. Further, by drying the resultant a resist pattern, in which the resist film (the coated film with the positive resist composition for immersion lithography) has been patterned in the shape according to a mask pattern can be obtained.

EXAMPLES

Hereinafter, the present invention will be illustrated in detail with reference to the following Examples, but these examples should not be construed as limiting the scope of the invention in any way.

Examples 1 to 3 and Comparative Examples 1 and 2

The components as shown in Table 1 were mixed and dissolved to prepare the positive resist compositions.

TABLE 1

| | Component (A) | | | Component (B) | Component (D) | Component (E) | Component (S) |
|---|---|---|---|---|---|---|---|
| Example 1 | (A)-1 [10] | (A)-3 [90] | — | (B)-1 [3] | (D)-1 [0.2] | — | (S)-1 [1200] |
| Example 2 | (A)-2 [10] | (A)-3 [90] | — | (B)-1 [3] | (D)-1 [0.2] | — | (S)-1 [1200] |
| Example 3 | (A)-2 [10] | (A)-4 [80] | (A)-5 [20] | (B)-2 [3] | (D)-1 [0.2] | (E)-1 [0.15] | (S)-1 [1200] |
| Comparative Example 1 | — | (A)-3 [100] | — | (B)-1 [3] | (D)-1 [0.2] | — | (S)-1 [1200] |
| Comparative Example 2 | — | (A)-4 [80] | (A)-5 [20] | (B)-2 [3] | (D)-1 [0.2] | (E)-1 [0.15] | (S)-1 [1200] |

Each of the symbols in Table 1 has the meaning as follows, and the values in [ ] represent blending amounts (arts by mass).

(A)-1 to (A)-5: the respective polymers represented by the formulas (A)-1 to (A)-5 described below. In the formulas (A)-1 to (A)-5, the values that were appended to the lower right of ( ) represent the ratio (mol %) of each structural unit.

(B)-1: triphenylsulfonim nonafluoro-n-butanesulfonate
(B)-2: (4-methylphenyl)diphenylsulfonium nonafluoro-n-butanesulfonate
(D)-1: triethanolamine
(E)-1: salicylic acid
(S)-1: mixed solvent of PGMEA/EL=80/20 (mass ratio)

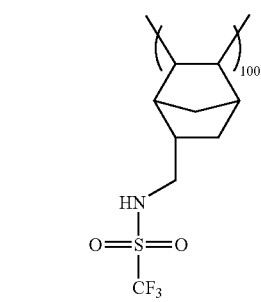

(A)-1

[Mw=5000, Mw/Mn=1.5, manufactured by Promerus Corporation]

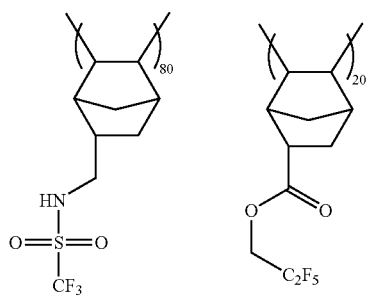

(A)-2

[Mw=5000, Mw/Mn=1.5; manufactured by Promerus Corporation]

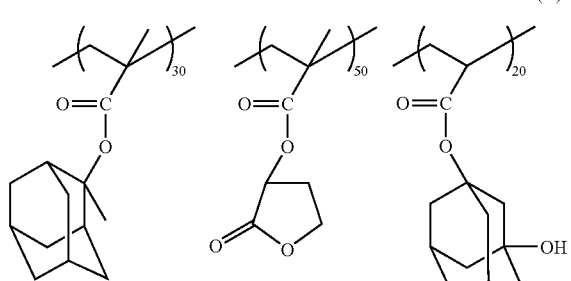

(A)-3

[Mw=10000, Mw/Mn=2.0]

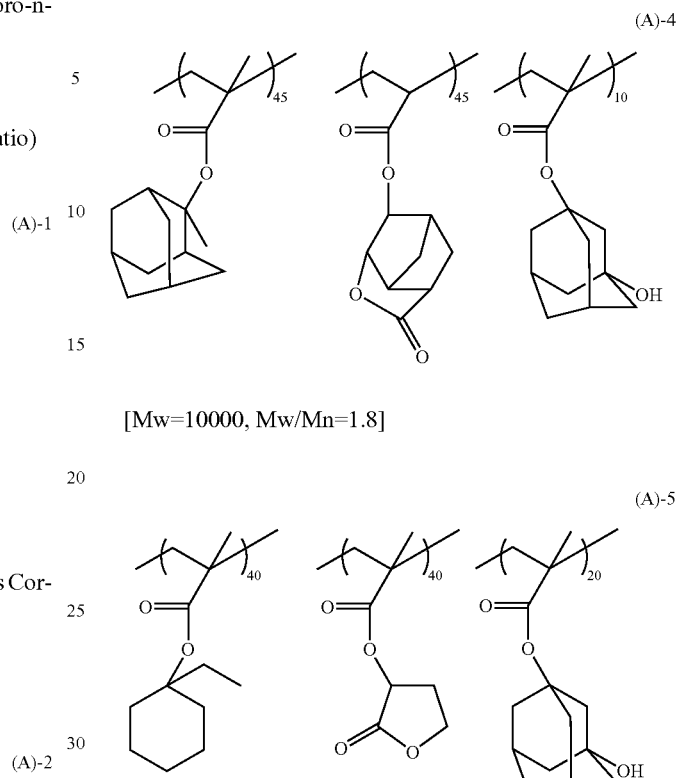

[Mw=10000, Mw/Mn=1.8]

[Mw=10000, Mw/Mn=1.6]

The obtained positive resist compositions were evaluated as follows.

<Measurement of Receding Angle and Sliding Angle>

The obtained positive resist composition was applied onto a silicon wafer with a diameter of 8 inch by using a spinner, and dried by prebaking at 115° C. for 60 seconds on a hot plate, to thereby form a resist film with a thickness of 275 nm. One drop (50 µL) of pure water was put onto the resist film, and then the receding angle and the sliding angle thereof (receding angle and sliding angle before exposure) were measured using the apparatus and conditions described below.

<Apparatus Name>
AUTO SLIDING ANGLE: SA-30 DM (manufactured by Kyowa Interface Science Co. Ltd.)
AUTO DISPENSER: AD-31 (manufactured by Kyowa Interface Science Co. Ltd.)

<Analysis Software (Attached to the Apparatus)>
FAMAS

In addition, a resist film was formed in the same way as the aforementioned, and open flame exposure (exposure through no mask) was conducted for the resist film with ArF excimer laser (193 nm) using the ArF exposure apparatus NSR-S302 (manufactured by Nikon Corporation, NA (numerical aperture)=0.60). The receding angle and the sliding angle of the exposed resist film (receding angle and sliding angle after exposure) were measured in the same way as the aforementioned.

The results of the receding angles and the sliding angles before and after exposure are shown in Table 2.

As shown by these results, Examples 1 to 3, where both of the resin (A1) [(A)-1 or (A)-2] and the resin (A2) [(A)-3, or (A)-4 and (A)-5] were used, showed the small sliding angles and the large receding angles in both cases before and after exposure, in comparison with Comparative Examples 1 and 2 where the resin (A2) was used alone. Also, each of the difference between the sliding angles before and after exposure and the difference between the receding angles before and after exposure became small.

TABLE 2

|  | Sliding Angle (°) | | Receding Angle (°) | |
| --- | --- | --- | --- | --- |
|  | Before Exposure | After Exposure | Before Exposure | After Exposure |
| Example 1 | 19.5 | 20.5 | 60.1 | 58.6 |
| Example 2 | 17.5 | 19.0 | 68.1 | 67.5 |
| Example 3 | 17.0 | 18.5 | 68.7 | 68.0 |
| Comparative Example 1 | 23.5 | 29.0 | 53.5 | 49.1 |
| Comparative Example 2 | 21.0 | 25.0 | 58.0 | 55.3 |

In the above evaluation, the sliding angle and the receding angle are for the evaluation of the hydrophilicity and hydrophobicity of the resist film. Because the receding angles became large and the sliding angles became small in Examples 1 to 3 in comparison with Comparative Examples 1 and 2, the hydrophobicities of the resist films in Examples 1 to 3 were improved in comparison with Comparative Examples 1 and 2.

<Lithography Properties>

An organic anti-reflective film composition "ARC-29" (trademark, manufactured by Brewer Science, Inc.) was applied onto an 8-inch silicon wafer by using a spinner, and sintered at 205° C. for 60 seconds on a hot plate to from an organic anti-reflective film having a film thickness of 77 nm. Each of the positive resist composition of Examples 1 to 3 and Comparative Examples 1 and 2 was applied onto the anti-reflective film by using a spinner, and dried by prebaking it on a hot plate at 115° C. for 60 seconds to form a resist film having a film thickness of 275 nm.

Subsequently, the obtained resist film was selectively irradiated with an ArF excimer laser (193 in) via a mask pattern by using an ArF exposure apparatus NSR-S302 (manufactured by Nikon Corporation, NA (numerical aperture)=0.60, ⅔ annular illumination). Then, PEB treatment was conducted at 115° C. for 60 seconds, developing was conducted for 30 seconds in an aqueous solution of tetramethylammonium hydroxide (TMAH) with a concentration of 2.38 mass % at 23° C., and then water rinsing was conducted with pure water for 30 seconds followed by shaken dry.

As a result, in any case of Examples 1 to 3 and Comparative Examples 1 and 2, a line and space resist pattern (referred to as L/S pattern hereinafter) having a line width of 120 nm and a pitch of 240 nm was formed.

In addition, when the obtained L/S patterns were observed using a scanning electron microscopy (SEM), good shape was found for each of the L/S patterns obtained using the positive resist composition of Examples 1 to 3 and Comparative Examples 1 and 2.

From these results, it was found that the resist film, which was formed by using the positive resist composition for immersion lithography containing both of the resin (A1) and the resin (A2), had high hydrophobicity. Also, the lithography properties thereof were the same as or better than those of the conventional chemical amplified positive resist composition. Therefore, in the current situation where an aqueous medium such as water has been considered as an immersion medium, it is apparent that the positive resist composition for immersion lithography of the present invention, which can form a resist film having high hydrophobicity and good lithography properties, is preferred for immersion lithography.

Examples 4 to 15 and Comparative Example 3

The components as shown in Table 3 were mixed and dissolved to prepare the positive resist compositions.

TABLE 3

|  | Component (A) | | Component (B) | Component (D) | Component (S) |
| --- | --- | --- | --- | --- | --- |
| Example 4 | (A)-6 [2.0] | (A)-9 [100] | (B)-2 [5.0] | (D)-1 [0.25] | (S)-2 [2200] |
| Example 5 | (A)-6 [5.0] | (A)-9 [100] | (B)-2 [5.0] | (D)-1 [0.25] | (S)-2 [2200] |
| Example 6 | (A)-6 [10.0] | (A)-9 [100] | (B)-2 [5.0] | (D)-1 [0.25] | (S)-2 [2200] |
| Example 7 | (A)-6 [20.0] | (A)-9 [100] | (B)-2 [5.0] | (D)-1 [0.25] | (S)-2 [2200] |
| Example 8 | (A)-7 [2.0] | (A)-9 [100] | (B)-2 [5.3] | (D)-1 [0.25] | (S)-2 [2200] |
| Example 9 | (A)-7 [5.0] | (A)-9 [100] | (B)-2 [5.0] | (D)-1 [0.25] | (S)-2 [2200] |
| Example 10 | (A)-7 [10.0] | (A)-9 [100] | (B)-2 [5.0] | (D)-1 [0.25] | (S)-2 [2200] |
| Example 11 | (A)-7 [20.0] | (A)-9 [100] | (B)-2 [5.0] | (D)-1 [0.25] | (S)-2 [2200] |
| Example 12 | (A)-8 [2.0] | (A)-9 [100] | (B)-2 [5.0] | (D)-1 [0.25] | (S)-2 [2200] |
| Example 13 | (A)-8 [3.0] | (A)-9 [100] | (B)-2 [5.0] | (D)-1 [0.25] | (S)-2 [2200] |
| Example 14 | (A)-8 [5.0] | (A)-9 [100] | (B)-2 [5.0] | (D)-1 [0.25] | (S)-2 [2200] |
| Example 15 | (A)-8 [10.0] | (A)-9 [100] | (B)-2 [5.0] | (D)-1 [0.25] | (S)-2 [2200] |
| Comparative Example 3 | — | (A)-9 [100] | (B)-2 [5.0] | (D)-1 [0.25] | (S)-2 [2200] |

Each of the symbols in Table 3 has the meaning as follows, and the values in [ ] represent blending amounts (parts by mass).

(A)-6: the polymer represented by the formula (A)-XY described below (manufactured by Promerus Corporation), in which x:y (molar ratio)=81.7:18.3, Mw=4800, and Mw/Mn=1.48.

(A)-7: the polymer represented by the formula (A)-XY described below (manufactured by Promerus Corporation), in which x:y (molar ratio)=72.8:27.2, Mw=3700 and, Mw/Mn=1.33.

(A)-8: the polymer represented by the formula (A)-XY described below (manufactured by Promerus Corporation), in which x:y (molar ratio)=47.5:52.5, Mw=4400, and Mw/Mn=1.93.

(A)-9: the polymer represented by the formula (A)-9 described below, in which Mw=10000 and Mw/Mn=2.1. In the formula (A)-9, the values that were appended to the lower right of ( ) represent the ratio (mol %) of each structural unit.

(B)-2 and (D)-1 are the same as the aforementioned, respectively.

(S)-2: mixed solvent of PGMEA/EL=60/40 (mass ratio)

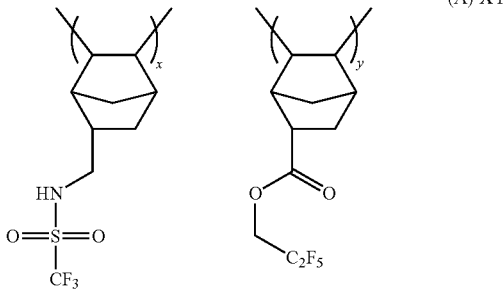

Using the obtained positive resist films, the measurement of the receding angle and the sliding angle were conducted in the same way as the aforementioned. Also, the measurement of the static contact angle was conducted using the same apparatus and the same procedure. The results are shown in Table 4. Also, the types of the used resin (A1) ((A)-6 to (A)-8)

and the resin (A2) (the content ratio of the resin (A1) to (A)-9 (hereinafter referred to as (A1) content (per (A2)); the unit: mass %) are additionally described in Table 4.

The static contact angle, the sliding angle, and the receding angle are for the evaluation of the hydrophilicity and hydrophobicity of the resist film. The static contact angles and the receding angles became large and the sliding angles became small in Examples 4 to 15 in comparison with Comparative Example 3. It was confirmed from these results that the hydrophobicities of the resist films in Examples 4 to 15 were improved in comparison with Comparative Example 3. In particular, the significant improvement effect of the hydrophobicity was confined in the examples where (A)-8 was used as (A1). For example, the significant effects were confirmed in Examples 12, 13, and 15 where the (A1) contents (per (A2)) were 3.0 mass %, 5.0 mass %, and 10.0 mass %, respectively.

TABLE 4

| | (A1) | | Static Contact Angle (°) | | Sliding Angle (°) | | Receding Angle (°) | |
|---|---|---|---|---|---|---|---|---|
| | Resin (A1) | Content (per (A2)) | Before Exposure | After Exposure | Before Exposure | After Exposure | Before Exposure | After Exposure |
| Example 4 | (A)-6 | 2.0 | 71.5 | 69.6 | 25.0 | 27.0 | 58.3 | 56.2 |
| Example 5 | | 5.0 | 73.5 | 74.1 | 23.0 | 23.0 | 61.9 | 62.6 |
| Example 6 | | 10.0 | 74.3 | 75.4 | 23.0 | 21.0 | 63.0 | 65.1 |
| Example 7 | | 20.0 | 75.2 | 75.5 | 20.0 | 19.0 | 65.9 | 66.9 |
| Example 8 | (A)-7 | 2.0 | 74.7 | 73.6 | 27.0 | 30.0 | 58.3 | 56.8 |
| Example 9 | | 5.0 | 78.2 | 78.0 | 24.0 | 25.0 | 64.6 | 62.0 |
| Example 10 | | 10.0 | 79.9 | 79.9 | 21.0 | 22.0 | 67.8 | 68.2 |
| Example 11 | | 20.0 | 81.0 | 82.6 | 21.0 | 17.0 | 69.1 | 71.6 |
| Example 12 | (A)-8 | 2.0 | 88.1 | 87.9 | 22.0 | 23.0 | 70.3 | 67.9 |
| Example 13 | | 3.0 | 90.8 | 92.3 | 20.0 | 18.0 | 75.0 | 75.1 |
| Example 14 | | 5.0 | 92.3 | 92.9 | 16.0 | 15.0 | 81.7 | 82.9 |
| Example 15 | | 10.0 | 94.2 | 95.2 | 13.0 | 12.0 | 86.0 | 87.3 |
| Comparative Example 3 | — | 0.0 | 65.8 | 66.3 | 35.0 | 40.0 | 48.3 | 42.7 |

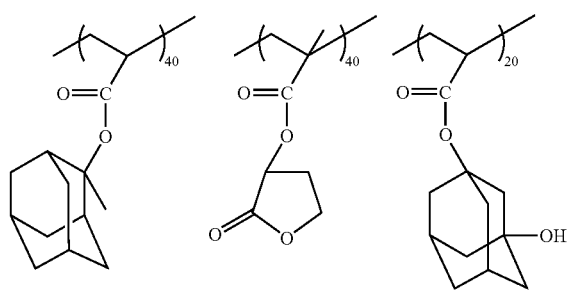

<Lithography Properties>

The resist patterns were formed in the same way as in the aforementioned <Lithography Properties> except for using the above obtained positive resist compositions and the mask pattern aimed at the hole pattern with a hole inner diameter of 140 nm and a pitch of 280 nm.

As a result, the hole patterns with a hole inner diameter of 140 nm and a pitch of 280 nm could be formed in respective Examples.

In addition, the optimal exposures (Eop) (Unit: $mJ/cm^2$ (energy amount per area)) for the formation of the hole patterns with a hole inner diameter of 140 nm and a pitch of 280 nm, i.e. sensitivities, were measured. Furthermore, the cross-sectional shapes of the obtained hole patterns were observed using SEM. As a result, the lithography properties in Examples 13 and 14 were particularly excellent.

INDUSTRIAL APPLICABILITY

The present invention is able to provide a resist composition for immersion lithography which is suitable for immersion lithography and can form a resist film in which the hydrophobicity of the film surface is high and the lithography properties are excellent, and a method for forming a resist pattern. Accordingly, the present invention is industrially very important.

The invention claimed is:

1. A positive resist composition for immersion lithography, comprising:
   a resin component (A) which exhibits increased alkali solubility under the action of acid; and
   an acid generator component (B) which generates acid on exposure, wherein the resin component (A) includes a cyclic main chain resin (A1) containing a fluorine atom and no acid-dissociable group, and a resin (A2) containing a structural unit (a) derived from an acrylic acid and no fluorine atom, wherein
   the resin (A2) contains a structural unit (a1) derived from an acrylate ester containing no fluorine atom and an acid-dissociable, dissolution-inhibiting group and a structural unit (a2) derived from an acrylate ester containing no fluorine atom and a lactone-containing cyclic group.

2. A positive resist composition for immersion lithography comprising:
   a resin component (A) which exhibits increased alkali solubility under the action of acid; and
   an acid generator component (B) which generates acid on exposure, wherein the resin component (A) includes a cyclic main chain resin (A1) containing a fluorine atom and no acid-dissociable group, and a resin (A2) containing a structural unit (a) derived from an acrylic acid and no fluorine atom, wherein
   the resin (A1) contains a structural unit (a'1) represented by a general formula (I)

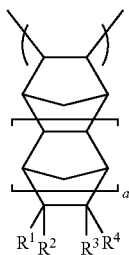

(I)

[In the formula (I), $R^1$ to $R^4$ each independently represents a hydrogen atom, a straight-chain or branched-chain alkyl group, a straight-chain or branched-chain fluorinated alkyl group, or a group (Ia) represented by a general formula (Ia), in which at least one of $R^1$ to $R^4$ represent the group (Ia); and a represents 0 or 1]

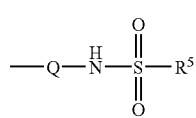

(Ia)

[In the formula (Ia), Q represents a straight-chain or branched-chain alkylene group having 1 to 5 carbon atoms; and $R^5$ represents a fluorinated alkyl group].

3. A positive resist composition for immersion lithography, comprising:
   a resin component (A) which exhibits increased alkali solubility under the action of acid; and
   an acid generator component (B) which generates acid on exposure, wherein the resin component (A) includes a cyclic main chain resin (A1) containing a fluorine atom and no acid-dissociable group, and a resin (A2) containing a structural unit (a) derived from an acrylic acid and no fluorine atom,
   wherein the resin (A1) contains a structural unit (a'1) represented by a general formula (I) and a structural unit (a'2) represented by a general formula (II)

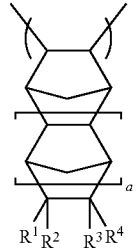

(I)

[In the formula (I), $R^1$ to $R^4$ each independently represents a hydrogen atom, a straight-chain or branched-chain alkyl group, a straight-chain or branched-chain fluorinated alkyl group, or a group (Ia) represented by a general formula (Ia), in which at least one of $R^1$ to $R^4$ represent the group (Ia); and a represents 0 or 1]

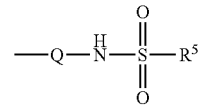

(Ia)

[In the formula (Ia), Q represents a straight-chain or branched-chain alkylene group having 1 to 5 carbon atoms; and $R^5$ represents a fluorinated alkyl group]

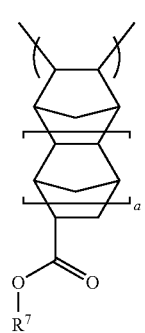

(II)

[In the formula (II), $R^7$ represents a fluorinated alkyl group; and a represents 0 or 1].

4. A positive method for forming a resist pattern, comprising: forming a resist film on a substrate using a resist composition for immersion lithography according to any one of claims 2, 3, and 1; conducting immersion exposure of the resist film; and developing the resist film to form the resist pattern.

5. A positive resist composition for immersion lithography according to claim 2, wherein the resin (A2) contains a structural unit (a1) derived from an acrylate ester containing no fluorine atom and an acid-dissociable, dissolution-inhibiting group.

6. A positive resist composition for immersion lithography according to claim 2, further comprising a nitrogen-containing organic compound (D).

7. A positive resist composition for immersion lithography according to claim 3, wherein the quantity of the resin (A1) in the resin component (A) is within a range from 0.1 to 50 mass %.

8. A positive resist composition for immersion lithography according to claim 3, wherein the resin (A2) contains a structural unit (a1) derived from an acrylate ester containing no fluorine atom and an acid-dissociable, dissolution-inhibiting group.

9. A positive resist composition for immersion lithography according to claim 8, wherein the resin (A2) further contains a structural unit (a2) derived from an acrylate ester containing no fluorine atom and a lactone-containing cyclic group.

10. A positive resist composition for immersion lithography according to claim 8, wherein the resin (A2) further contains a structural unit (a3) derived from an acrylate ester containing no fluorine atom and a polar group-containing aliphatic hydrocarbon group.

11. A positive resist composition for immersion lithography according to claim 3, further comprising a nitrogen-containing organic compound (D).

12. A positive resist composition for immersion lithography according to claim 1, wherein the resin (A1) contains a structural unit (a'1) represented by a general formula (I)

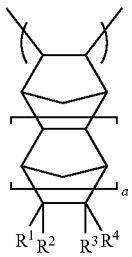

(I)

[In the formula (I), $R^1$ to $R^4$ each independently represents a hydrogen atom, a straight-chain or branched-chain alkyl group, a straight-chain or branched-chain fluorinated alkyl group, or a group (Ia) represented by a general formula (Ia), in which at least one of $R^1$ to $R^4$ represent the group (Ia); and a represents 0 or 1]

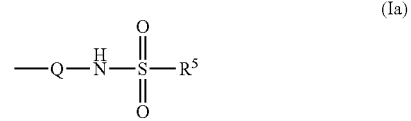

(Ia)

[In the formula (Ia), Q represents a straight-chain or branched-chain alkylene group having 1 to 5 carbon atoms; and $R^5$ represents a fluorinated alkyl group].

13. A positive resist composition for immersion lithography according to claim 1, wherein the resin (A2) further contains a structural unit (a3) derived from an acrylate ester containing no fluorine atom and a polar group-containing aliphatic hydrocarbon group.

14. A positive resist composition for immersion lithography according to claim 1, further comprising a nitrogen-containing organic compound (D).

15. A positive resist composition for immersion lithography according to claim 2, wherein the quantity of the resin (A1) in the resin component (A) is within a range from 0.1 to 50 mass %.

16. A positive resist composition for immersion lithography according to claim 6, wherein the quantity of the resin (A1) in the resin component (A) is within a range from 0.1 to 50 mass %.

* * * * *

UNITED STATES PATENT AND TRADEMARK OFFICE
CERTIFICATE OF CORRECTION

| | |
|---|---|
| PATENT NO. | : 7,799,507 B2 |
| APPLICATION NO. | : 12/300760 |
| DATED | : September 21, 2010 |
| INVENTOR(S) | : Endo et al. |

It is certified that error appears in the above-identified patent and that said Letters Patent is hereby corrected as shown below:

Page 1 (Item 73), Assignee Line 1 After "Ohka" insert --Kogyo--.

Column 1, Line 29 Change "her" to --further--.

Column 2, Line 9 Change "nm," to --µm,--.

Column 2, Line 12 Change "miniaturization" to --miniaturization,--.

Column 2, Line 13 Change "ma)," to --nm),--.

Column 3, Line 14 Change "currently" to --currently,--.

Column 3, Line 51 Change "aspect" to --aspect,--.

Column 4, Line 21 Change "au" to --an--.

Column 4, Line 23 Change "A))." to --(B)).--.

Column 4, Line 27 Change "result" to --result,--.

Column 4, Line 41 Change "dose" to --does--.

Column 4, Line 62 Change "Inhibiting" to --inhibiting--.

Column 5, Line 45 Change "its" to --units--.

Column 5, Line 57 Change "wits," to --units,--.

Column 6, Line 21 Change "(I)" to --(I),--.

Column 6, Line 24 Change "(a)," to --(Ia),--.

Column 7, Line 61 (Approx.) Change "sight-chain" to --straight-chain--.

Column 8, Line 44 Change "10" to --100--.

Column 8, Line 46 Change "included" to --included,--.

Column 9, Line 38 Change "with" to --unit--.

Column 9, Line 41 Change "11" to --10--.

Column 9, Line 42 Change "mol %" to --mol %,--.

Column 10, Line 60 Change "group" to --group,--.

Signed and Sealed this
Twenty-ninth Day of March, 2011

David J. Kappos
*Director of the United States Patent and Trademark Office*

CERTIFICATE OF CORRECTION (continued)
U.S. Pat. No. 7,799,507 B2

Column 11, Line 47 Change "foams" to --foam,--.

Column 12, Line 4 (Approx.) Change "(A1)]" to --(A2)]--.

Column 12, Line 14 Change "(A1)," to --(A2),--.

Column 12, Line 64 Change "with" to --unit--.

Column 13, Line 6 Change "below," to --below.--.

Column 13, Line 47 Change "(A1)" to --(A2)--.

Column 14, Line 41 After "chain" insert --,--.

Column 14, Line 43-44 Change "tertbutyl" to --tert-butyl--.

Column 16, Line 5 Change "dissolution inhibiting" to --dissolution-inhibiting--.

Column 17, Line 8 Change "preferably" to --(preferably--.

Column 17, Line 9 Change "axe" to --are--.

Column 17, Line 34 Change "atom" to --atom,--.

Column 19, Line 40 Change "In" to --n--.

Column 50, Line 49 Change "it" to --unit--.

Column 50, Line 51 Change "(A1)," to --(A2),--.

Column 51, Line 7 Change "films" to --film,--.

Column 59, Line 41 Change "(a1)" to --(a2)--.

Column 59, Line 65 Change "polycyclic" to --(polycyclic--.

Column 60, Line 23 Change "11" to --10--.

Column 60, Line 57 Change "groups" to --group,--.

Column 61, Line 50 Change "below," to --below.--.

Column 62, Line 62 (Approx.) Change "(Ea)" to --(a3)--.

Column 63, Line 52 (Approx.) Change "ranges" to --range,--.

Column 63, Line 53 (Approx.) Change "resist" to --resist,--.

Column 63, Line 66 Change "(A1)" to --(A2)--.

Column 64, Line 14 Change "polybis" to --poly(bis--.

Column 64, Line 15 Change "diazometanes," to --diazomethanes,--.

Column 64, Line 20 Change "below," to --below.--.

Column 64, Line 38 Change "chain" to --chain,--.

Column 66, Line 16 (Approx.) Change "(b-2);" to --(b-2):--.

Column 67, Line 30 Change "$R^{5'}$" to --$R^{5''}$--.

Column 67, Line 35 Change "groups," to --groups.--.

Column 68, Line 5 Change "sane" to --same--.

Column 68, Line 5 Change "b-2))." to --(b-2)).--.

Column 68, Line 37 Change "with" to --within--.

CERTIFICATE OF CORRECTION (continued)
U.S. Pat. No. 7,799,507 B2

Column 68, Line 47 Change "au" to --all--.

Column 68, Line 66 Change "aid" to --and--.

Column 74, Line 9 Change "her" to --further--.

Column 74, Line 62 Change "her" to --further--.

Column 75, Line 46 Change "γ-butyrolacetone;" to --γ-butyrolactone;--.

Column 76, Line 13 Change "solvent" to --solvent,--.

Column 76, Line 14 Change "91," to --9:1,--.

Column 76, Line 15 Change "solvent" to --solvent,--.

Column 80, Line 22 Change "conduced." to --conducted.--.

Column 80, Line 28 Change "resultant" to --resultant,--.

Column 80, Line 61 Change "(arts" to --(parts--.

Column 81, Line 1 Change "triphenylsulfonim" to --triphenylsulfonium--.

Column 83, Line 35 Change "from" to --form--.

Column 83, Line 43 Change "in)" to --nm)--.

Column 83, Line 54 Change "pattern" to --pattern,--.

Column 86, Line 15 (Approx.) Change "confined" to --confirmed--.

Column 87, Line 49 In Claim 2, change "1]" to --1.]--.

Column 88, Line 26 In Claim 3, change "1]" to --1.]--.

Column 89, Line 27 In Claim 12, change "(I)" to --(I).--.

Column 90, Line 6 In Claim 12, change "1]" to --1.]--.

Column 90, Line 34 In Claim 16, change "claim 6," to --claim 1,--.